(12) United States Patent
Abe

(10) Patent No.: US 10,153,739 B2
(45) Date of Patent: Dec. 11, 2018

(54) POWER AMPLIFICATION DIVISION CIRCUIT AND MULTI-STAGE TYPE POWER AMPLIFICATION DIVISION CIRCUIT

(71) Applicant: Panasonic Corporation, Osaka (JP)

(72) Inventor: Takayuki Abe, Kanagawa (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 15/890,917

(22) Filed: Feb. 7, 2018

(65) Prior Publication Data
US 2018/0278219 A1    Sep. 27, 2018

(30) Foreign Application Priority Data

Mar. 21, 2017   (JP) ................................ 2017-054613
Nov. 14, 2017   (JP) ................................ 2017-218917

(51) Int. Cl.
    *H03F 3/45*          (2006.01)
    *H03F 1/56*          (2006.01)
    (Continued)

(52) U.S. Cl.
    CPC ............... *H03F 1/565* (2013.01); *H03F 3/19* (2013.01); *H03F 3/211* (2013.01);
    (Continued)

(58) Field of Classification Search
    CPC ........................................................ H03F 3/45
    (Continued)

(56) References Cited

U.S. PATENT DOCUMENTS 7,760,023 B2 *   7/2010   Bockelman ........... H01L 23/645
                                                  330/124 R
7,973,603 B2 *   7/2011   Kammula ........... H03F 3/45179
                                                   330/188

(Continued)

OTHER PUBLICATIONS

Maryam Tabesh et al., "A 65nm CMOS 4-Element Sub-34mW/Element 60GHz Phased-Array Transceiver", 2011 IEEE International Solid-State Circuits Conference (ISSCC), Feb. 20, 2011, pp. 166-166.

(Continued)

*Primary Examiner* — Henry Choe
(74) *Attorney, Agent, or Firm* — Greenblum & Bernstein, P.L.C.

(57) ABSTRACT

A power amplification division circuit includes a conversion element having a one-turn annular first inductor and an N-turn annular second inductor in a shape along a portion of the first inductor and converting an input signal into positive and negative phase signals, a first transistor in which a source is connected with a third power source and a gate receives the positive signal, a second transistor in which a source is connected with a fourth power source and a gate receives the negative phase signal, a first impedance circuit connected between the gate of the first transistor and a drain of the second transistor, a second impedance circuit connected between the gate of the second transistor and a drain of the first transistor, and an output matching circuit connected with the drains of the first and second transistors and outputting first and second divided signals.

10 Claims, 18 Drawing Sheets

(51) Int. Cl.
*H03F 3/21* (2006.01)
*H03F 3/19* (2006.01)

(52) U.S. Cl.
CPC .. *H03F 2200/387* (2013.01); *H03F 2200/451* (2013.01); *H03F 2203/21139* (2013.01)

(58) Field of Classification Search
USPC ........................................ 330/252, 253, 261
See application file for complete search history.

(56) References Cited

U.S. PATENT DOCUMENTS

| | | | |
|---|---|---|---|
| 8,971,831 B2* | 3/2015 | Vidojkovic | H03F 3/45071 330/109 |
| 2013/0033321 A1* | 2/2013 | Lindstrand | H03F 1/523 330/253 |
| 2013/0222064 A1* | 8/2013 | Kimball | H03F 1/0261 330/253 |
| 2016/0056769 A1* | 2/2016 | Takenaka | H03F 1/0211 330/253 |

OTHER PUBLICATIONS

Maryam Tabesh et al., "A 65nm CMOS 4-Element Sub-34mW/Element 60GHz Phased-Array Transceiver", IEEE Journal of Solid-State Circuits, vol. 46, No. 12, Dec. 2011, pp. 3018-3032.

* cited by examiner

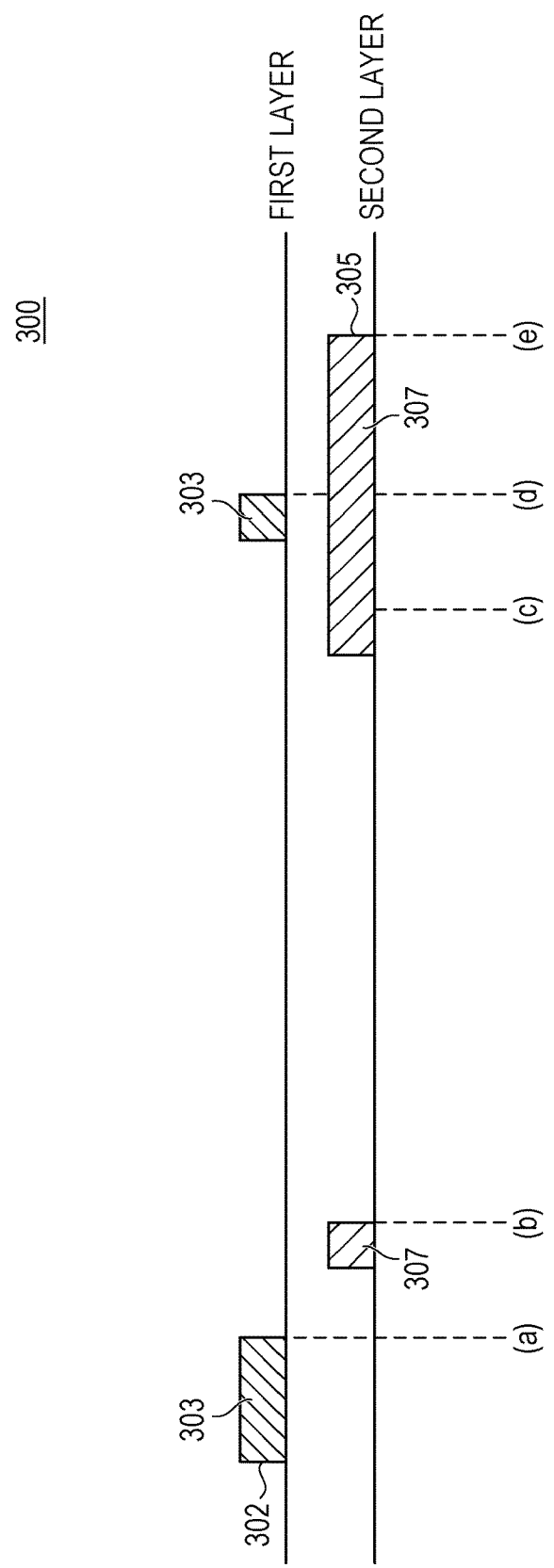

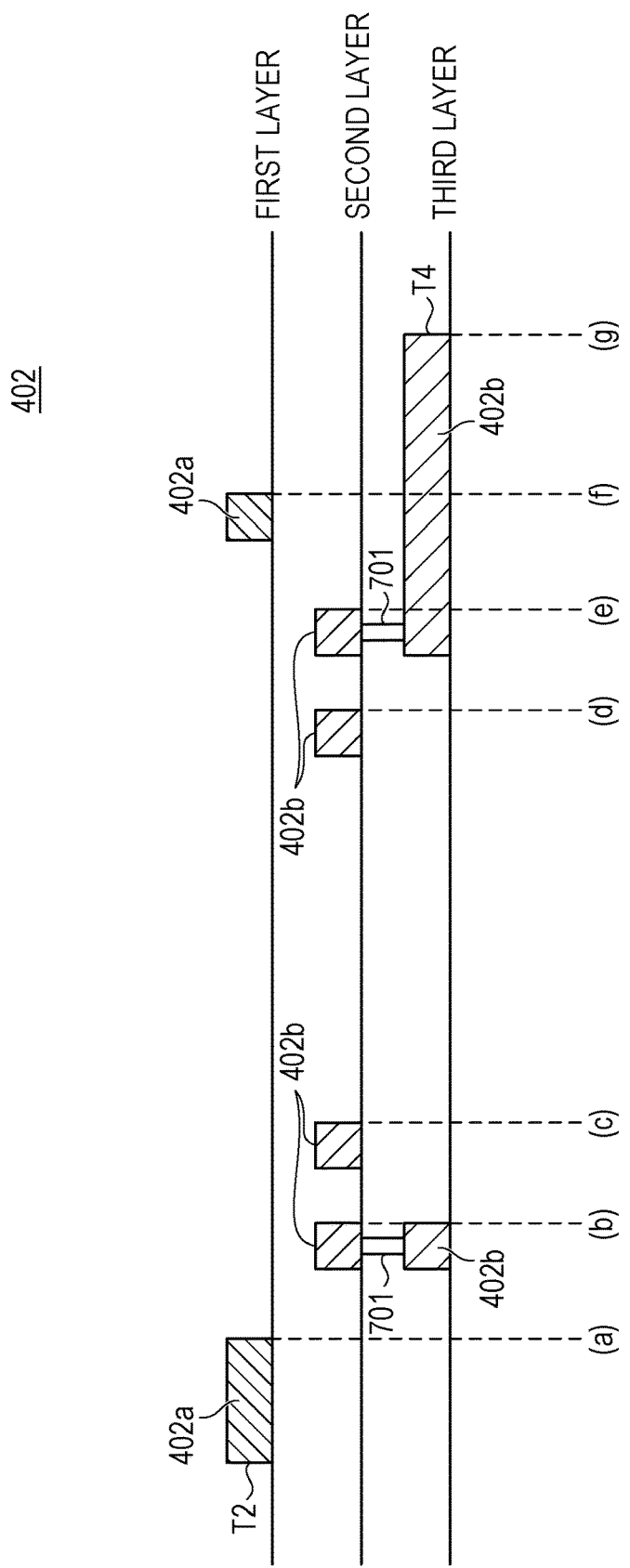

POWER AMPLIFICATION DIVISION CIRCUIT AND MULTI-STAGE TYPE POWER AMPLIFICATION DIVISION CIRCUIT

BACKGROUND

1. Technical Field

The present disclosure relates to a power amplification division circuit and a multi-stage type power amplification division circuit.

2. Description of the Related Art

In recent years, a millimeter-wave band has been attracting attention in radio techniques represented by communication and radars because broadband signals may be used. For example, among the millimeter-wave bands, a 60 GHz band has been used for high-speed communication, and a 76 GHz band has been used for high resolution radars. Further, expansion to frequency bands that exceed 100 GHz has been expected for the purpose of a further performance improvement in the future.

In order to realize the high-speed communication and high resolution radars in millimeter-wave bands, schemes such as beamforming and multiple-input multiple-output (MIMO) are used as transmission-reception schemes of radio signals. In the schemes such as beamforming and MIMO, the power of a signal is amplified, the amplified signal is divided into plural systems, and signal processing is performed for the divided signal of each system. Thus, in the schemes such as beamforming and MIMO, a circuit has been discussed which amplifies the power of a signal and divides the signal into plural systems.

For example, "A 65 nm CMOS 4-Element Sub-34 mW/Element 60 GHz Phased-Array Transceiver" IEEE Int. Solid-State Circuits Conf. (ISSCC) Dig. Tech. Papers, 2011, pp. 20-24 discloses a circuit that amplifies the power of a signal in a millimeter-wave band and divides the signal to plural systems.

SUMMARY

However, a circuit disclosed in "A 65 nm CMOS 4-Element Sub-34 mW/Element 60 GHz Phased-Array Transceiver" IEEE Int. Solid-State Circuits Conf. (ISSCC) Dig. Tech. Papers, 2011, pp. 20-24 uses an operation principle that uses the wavelength of a signal that passes, is thus subject to large power loss accompanying enlargement of the size of the circuit, and thus has a low amplification factor.

One non-limiting and exemplary embodiment facilitates providing a small-sized power amplification division circuit and a multi-stage type power amplification division circuit that may amplify the power of a signal with high efficiency and divide the signal into plural systems.

In one general aspect, the techniques disclosed here feature a power amplification division circuit including: a conversion element that has a one-turn annular first inductor, the first inductor being provided with a first terminal to which an input signal is input and a second terminal which is connected with a first power source, and an N-turn (N is a greater number than one) annular second inductor, the second inductor being provided with a third terminal which outputs a positive phase signal, a fourth terminal which outputs a negative phase signal, and a fifth terminal which is connected with a second power source and being in a shape along a portion of the first inductor, and that converts the input signal into the positive phase signal and the negative phase signal; a first transistor in which a source is connected with a third power source and the positive phase signal is input to a gate; a second transistor in which a source is connected with a fourth power source and the negative phase signal is input to a gate; a first impedance circuit that is connected between the gate of the first transistor and a drain of the second transistor; a second impedance circuit that is connected between the gate of the second transistor and a drain of the first transistor; and an output matching circuit that is connected with the drain of the first transistor and the drain of the second transistor and respectively outputs a first divided signal and a second divided signal from a first output terminal and a second output terminal.

One aspect of the present disclosure may provide a small-sized power amplification division circuit that may amplify the power of a signal with high efficiency and divide the signal into plural systems.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 3B is a cross-sectional diagram taken along line IIIB-IIIB in FIG. 3A;

FIG. 8B is a cross-sectional diagram taken along line VIIIB-VIIIB in FIG. 8A;

DETAILED DESCRIPTION

Figure 1:
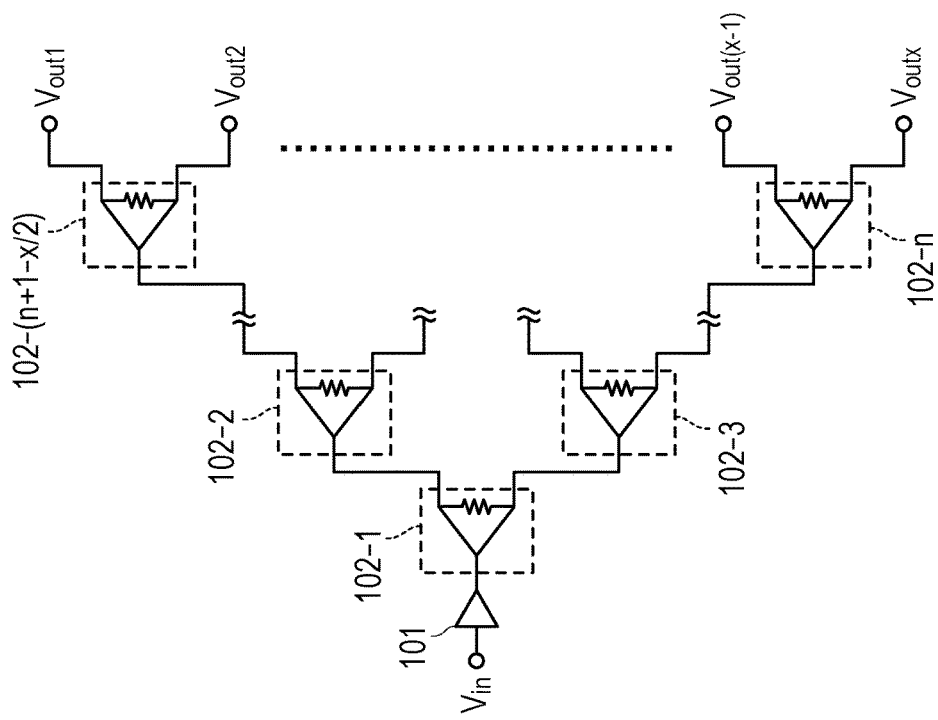
FIG. 1 is a diagram that illustrates a configuration of a power amplification division circuit disclosed in "A 65 nm CMOS 4-Element Sub-34 mW/Element 60 GHz Phased-Array Transceiver" IEEE Int. Solid-State Circuits Conf. (ISSCC) Dig. Tech. Papers, 2011, pp. 20-24.

FIG. 1 is a diagram that illustrates a configuration of a power amplification division circuit 100 that is disclosed in "A 65 nm CMOS 4-Element Sub-34 mW/Element 60 GHz Phased-Array Transceiver" IEEE Int. Solid-State Circuits Conf. (ISSCC) Dig. Tech. Papers, 2011, pp. 20-24.

The power amplification division circuit 100 has an amplifier circuit 101 and Wilkinson power divider circuits 102-1 to 102-n.

The amplifier circuit 101 is a single-phase input-output amplifier circuit, amplifies an input signal $V_{in}$, and outputs the amplified signal to the Wilkinson power divider circuit 102-1.

The Wilkinson power divider circuit 102-1 divides the signal that is input from the amplifier circuit 101 into two systems, outputs one signal of the divided signals to the Wilkinson power divider circuit 102-2, and outputs the other signal to the Wilkinson power divider circuit 102-3. The Wilkinson power divider circuits 102-2 to the Wilkinson power divider circuit 102-n similarly divide the input signal into two systems.

In this configuration, the power amplification division circuit 100 that is disclosed in "A 65 nm CMOS 4-Element Sub-34 mW/Element 60 GHz Phased-Array Transceiver" IEEE Int. Solid-State Circuits Conf. (ISSCC) Dig. Tech. Papers, 2011, pp. 20-24 amplifies the input signal $V_{in}$, and divides the input signal into output signals (an output signal $V_{out1}$ to an output signal $V_{outx}$) of x systems (x is an integer that is two or greater).

However, the Wilkinson power divider circuits 102-1 to 102-n use an operation principle that uses the wavelength of a signal that passes, is thus subject to large power loss accompanying enlargement of the circuit size, and thus has a low amplification factor.

As an index for evaluating the performance (for example, the magnitude of power loss) of an amplifier circuit in a high-frequency wave band, a maximum available gain (MAG) and a stability coefficient (Kf) are present.

The MAG indicates the theoretical maximum amplification factor in the configuration of the amplifier circuit. The Kf quantitatively indicates whether the amplifier circuit oscillates. The MAG and Kf are expressed by the following formula (1) and formula (2) by using Y parameters (Y11, Y12, Y21, and Y22) of the amplifier.

$$MAG = |Y21/Y12|*(Kf - (Kf\hat{}2 - 1)\hat{}(1/2)) \quad (1)$$

$$Kf = \{2Re[Y11]Re[Y22] - Re[Y12*Y21]\}/|Y21*Y12| \quad (2)$$

The larger value of MAG means that the theoretical power loss of the amplifier circuit is smaller and a signal may be amplified with higher efficiency. Further, the larger value of Kf means that oscillation of the amplifier circuit is regulated more and the signal may be amplified more stably.

Figure 2:
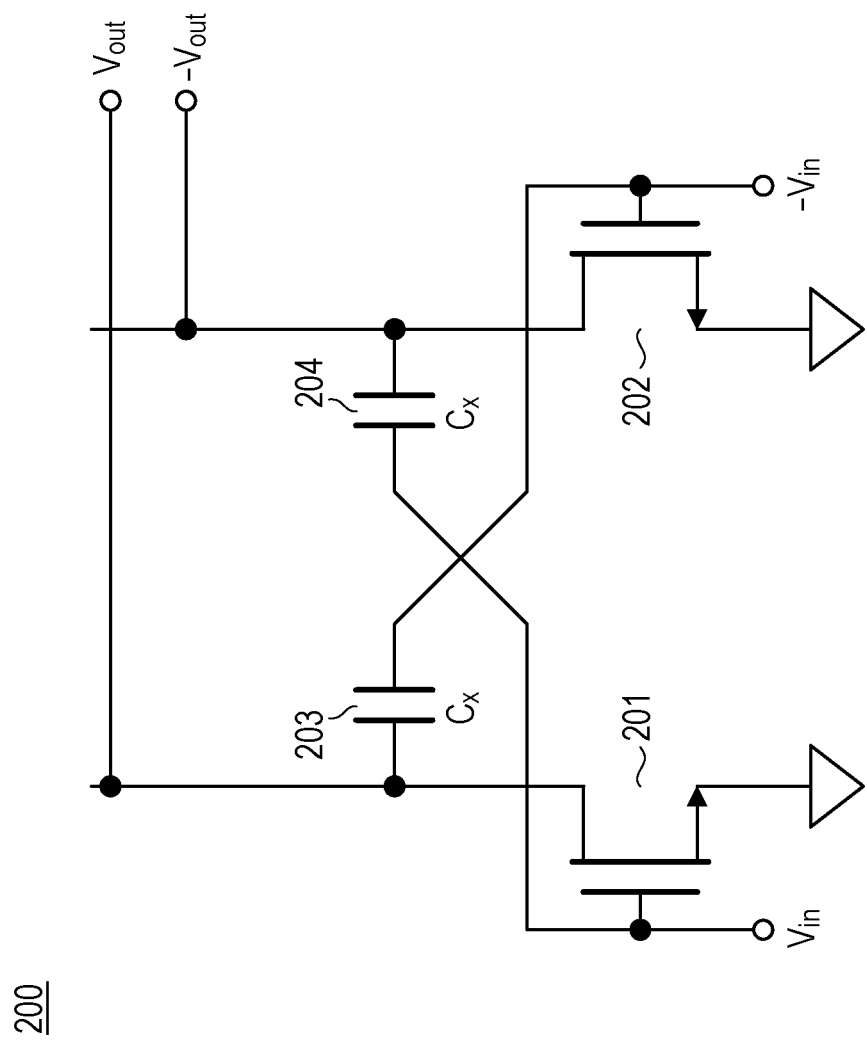
FIG. 2 is a diagram that illustrates a configuration of a differential amplifier circuit which uses a cross-coupled capacitor.

As a configuration for amplifying a signal in a millimeter-wave band with high efficiency, a differential amplifier circuit is present which uses a cross-coupled capacitor. FIG. 2 is a diagram that illustrates a configuration of a differential amplifier circuit 200 which uses the cross-coupled capacitor.

The differential amplifier circuit 200 has a transistor 201, a transistor 202, a capacitor 203, and a capacitor 204. The input signal $V_{in}$ and an input signal $-V_{in}$ are input to the differential amplifier circuit 200. The phase of the input signal $V_{in}$ and the phase of the input signal $-V_{in}$ are different by 180°.

A source terminal of the transistor 201 is grounded. The input signal $V_{in}$ is input to a gate terminal of the transistor 201. A source terminal of the transistor 202 is grounded. The input signal $-V_{in}$ is input to a gate terminal of the transistor 202.

The capacitor 203 has a capacitance value Cx and is connected between a drain terminal of the transistor 201 and the gate terminal of the transistor 202. The capacitor 204 has the capacitance value Cx and is connected between a drain terminal of the transistor 202 and the gate terminal of the transistor 201.

Further, the gate terminal of the transistor 201 and the gate terminal of the transistor 202 are connected with an input matching circuit, which is not illustrated. A gate voltage of the transistor 201 and the transistor 202 are supplied via the input matching circuit.

Further, the drain terminal of the transistor 201 and the drain terminal of the transistor 202 are connected with an output matching circuit, which is not illustrated. A drain voltage of the transistor 201 and the transistor 202 are supplied via the output matching circuit.

Further, an output signal $V_{out}$ is output from the drain terminal side of the transistor 201, and an output signal $-V_{out}$ is output from the drain terminal side of the transistor 202. The phase of the output signal $V_{out}$ and the phase of the output signal $-V_{out}$ are different by 180°.

The Y parameters Y12 and Y21 of the differential amplifier circuit 200 are respectively expressed by the following formulas (3) and (4).

$$Y12 = -j\omega(Cgd - Cx) \quad (3)$$

$$Y21 = gm - j\omega(Cgd - Cx) \quad (4)$$

Here, Cgd represents the value of the parasitic capacitance between the gate and drain of each of the transistor 201 and the transistor 202, and gm represents the transconductance of each of the transistor 201 and the transistor 202.

In the formulas (3) and (4), the parasitic capacitance value Cgd is canceled by the capacitance value Cx, and Y12 and Y21 may thereby be made smaller. Particularly, Y12 becomes smaller, the value of MAG indicated by the formula (1) thereby becomes larger, and the theoretical amplification factor of the differential amplifier circuit 200 increases. Further, Y12 becomes smaller, the value of Kf indicated by the formula (2) thereby becomes larger, and the stability of the differential amplifier circuit 200 is improved. That is, Y12 becomes smaller, and the amplification factor and the stability of the differential amplifier circuit 200 are thereby improved.

In order to apply the differential amplifier circuit 200 illustrated in FIG. 2 to the power amplification division circuit, baluns that convert the single-phase signal into differential signals are requested on both of input and output sides. Configurations of a balun may include a distributed constant type configuration such as a rat race type and a lumped constant type configuration such as a transformer type.

The distributed constant type configuration is subject to a large circuit size and large power loss similarly to the Wilkinson power divider circuits 102-1 to 102-n that are illustrated in FIG. 1. Meanwhile, the lumped constant type balun such as the transformer type has advantages of a small size and low loss.

However, in the balun that has the lumped constant type configuration such as the transformer type, the phase error of the converted differential signals becomes large due to asymmetry of a structure or an internal parasitic component or an external parasitic component due to a connection destination. Taking the phase error into consideration, Y12 and Y21 that are expressed by the formulas (3) and (4) may respectively be substituted into the following formulas (5) and (6).

$$Y12 = -j\omega(Cgd - Cx^*EXP(j\theta_b)) \quad (5)$$

$$Y21 = gm1 - j\omega(Cgd - Cx^*EXP(j\theta_a)) \quad (6)$$

Here, $\theta_a$ and $\theta_b$ are the phase errors to the theoretical differential signals. Specifically, $\theta_a$ and $\theta_b$ represent the phase errors from 180°. Each of $\theta_a$ and $\theta_b$ becomes a function of a frequency f of the signal.

In a case where $\theta_a$ and $\theta_b$ that are the functions of the frequency f of the signal form 180° at a specific frequency fs, the values of $EXP(j\theta_b)$ and $EXP(j\theta_a)$ become −1. Thus, the terms with Cx (that is, $-Cx^*EXP(j\theta_b)$ and $-Cx^*EXP(j\theta_a)$) of the formulas (5) and (6) become positive, and positive feedback occurs in the differential amplifier circuit 200 at the frequency fs. Accordingly, the differential amplifier circuit 200 becomes unstable and possibly oscillates.

Figure 3A:
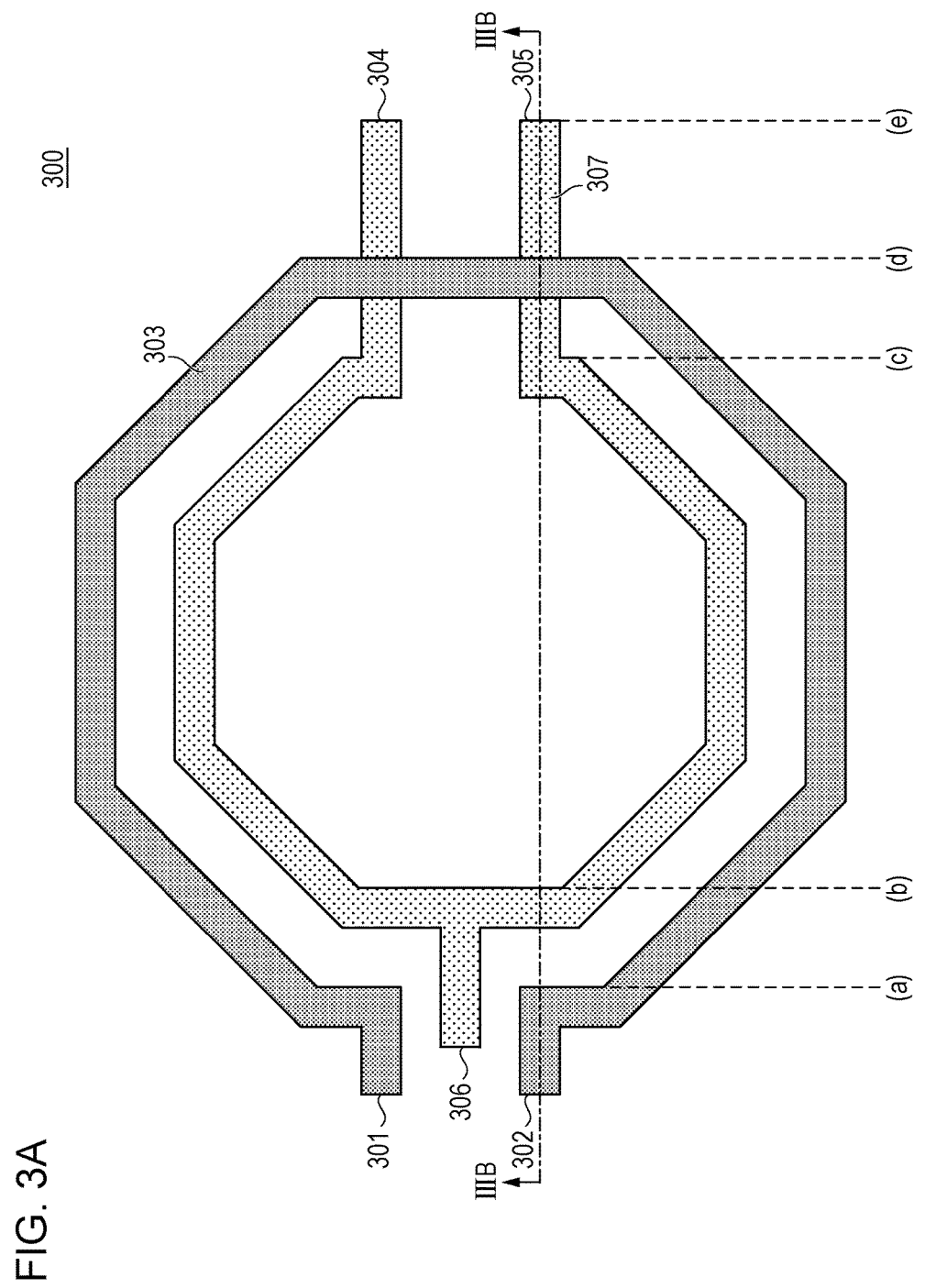
FIG. 3A is a plan diagram that illustrates one example of a one-turn transformer type balun.

Examples of the configuration of the balun that regulates the phase error may be the configurations illustrated in FIG. 3A and FIG. 3B, for example. FIG. 3A is a plan diagram that illustrates one example of a one-turn transformer type balun 300. FIG. 3B is a cross-sectional diagram taken along line IIIB-IIIB in FIG. 3A. (a) to (e) in FIG. 3B respectively correspond to (a) to (e) in FIG. 3A.

The transformer type balun 300 illustrated in FIG. 3A is configured with an unbalanced side annular inductor 303 that has a terminal 301 and a terminal 302 and a balanced side annular inductor 307 that has a terminal 304, a terminal 305, and a terminal 306.

Each of the unbalanced side annular inductor 303 and the balanced side annular inductor 307 is a one-turn annular inductor that is highly symmetric. In the plan diagram illustrated in FIG. 3A, an annular portion of the balanced side annular inductor 307 is provided on the inside of an annular portion of the unbalanced side annular inductor 303. As illustrated in FIG. 3B, the unbalanced side annular inductor 303 is provided in a first layer, and the balanced side annular inductor 307 is provided in a second layer that is positioned in a lower layer than the first layer. Note that the unbalanced side annular inductor 303 and the balanced side annular inductor 307 may be in the same size, or the balanced side annular inductor 307 may be larger than the unbalanced side annular inductor 303.

The terminal 301 is a terminal to which a single-phase input signal is input, and the terminal 302 is a terminal to which a DC power source is supplied. The terminal 304 is a terminal to which a positive phase output signal is output, the terminal 305 is a terminal to which a negative phase output signal is output, and the terminal 306 is a center tap terminal to which a DC power source is supplied. Note that the DC power source may be supplied to the terminal 301, and the single-phase input signal may be input to the terminal 302. In this case, the positive phase output signal is output from the terminal 305, and the negative phase output signal is output from the terminal 304.

The transformer type balun 300 illustrated in FIG. 3A and FIG. 3B is in the configuration in which the one-turn annular inductor which is highly symmetric is used for each of the balanced side and the unbalanced side and may thus convert the single-phase signal into the differential signals while regulating the phase error.

However, in the transformer type balun 300 illustrated in FIG. 3A and FIG. 3B, the inductor is limited to the one-turn annular inductor, and it is difficult to use N-turn (N is an integer that is two or greater) annular inductor. Thus, the degree of freedom of design is low, and it is difficult to obtain the optimal impedance condition in the differential amplifier circuit. Thus, the amplification factor of the differential amplifier circuit becomes low.

In consideration of such a circumstance, it is desirable to provide a small-sized power amplification division circuit that may amplify the power of a signal with high efficiency and divide the signal.

Embodiments of the present disclosure will hereinafter be described in detail with reference to drawings. Note that the embodiments described in the following are merely examples, and the present disclosure is not limited by the embodiments described in the following.

First Embodiment

Figure 4:
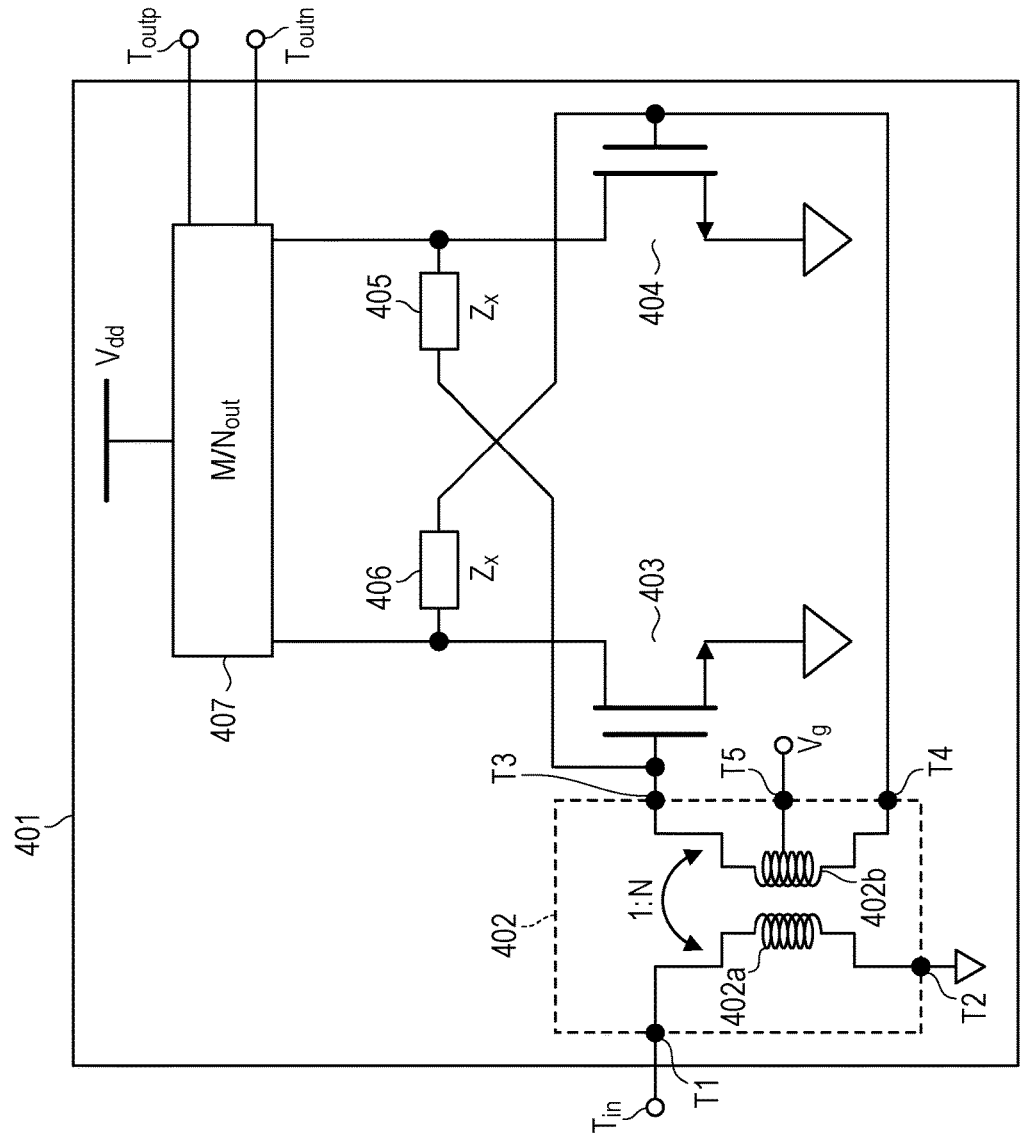
FIG. 4 is a circuit diagram that illustrates a configuration example of a power amplification division circuit according to a first embodiment of the present disclosure.

FIG. 4 is a circuit diagram that illustrates a configuration example of a power amplification division circuit 401 according to a first embodiment of the present disclosure. The power amplification division circuit 401 amplifies an input signal that is input from an input terminal $T_{in}$, outputs a positive phase output signal from an output terminal $T_{outp}$, and outputs a negative phase output signal from an output terminal $T_{outn}$. That is, the power amplification division circuit 401 is a divider circuit that divides an input signal of one system into output signals of two systems.

The power amplification division circuit 401 illustrated in FIG. 4 has a transformer type balun 402, a transistor 403, a transistor 404, an impedance circuit 405, an impedance circuit 406, and an output matching circuit 407.

The transformer type balun 402 is a single-phase differential conversion circuit that converts an input signal into a positive phase signal and a negative phase signal. Further, the transformer type balun 402 also functions as an input matching circuit that performs impedance conversion.

The transformer type balun 402 has an unbalanced side inductor 402a that is an annular inductor and a balanced side inductor 402b that is an annular inductor. The balanced side inductor 402b has a shape along a portion of the unbalanced side inductor 402a (see FIG. 7A and FIG. 7B, which will be described later). The turn ratio between the unbalanced side inductor 402a and the balanced side inductor 402b is one to N (N is an integer that is two or greater).

The unbalanced side inductor 402a has a terminal T1 that is connected with the input terminal $T_{in}$ and a terminal T2 that is connected with a ground (GND). The input signal is input to the terminal T1, and a voltage of 0 V is supplied to the terminal T2. Note that the terminal T2 may be connected with a DC power source that supplies another voltage than 0 V.

The balanced side inductor 402b has a terminal T3 to which the positive phase signal is output, a terminal T4 to which the negative phase signal is output, and a terminal (center tap terminal) T5 to which a DC power source $V_g$ is supplied.

The transformer type balun 402 is configured by magnetic field coupling of the unbalanced side inductor 402a and the balanced side inductor 402b and functions as a balun that converts the input signal which is input from the terminal T1 into two signals which are in mutually opposite phases.

That is, the transformer type balun 402 is a conversion element that has the one-turn annular unbalanced side inductor 402a (first inductor) which is provided with the terminal T1 (first terminal) to which the input signal is input and the terminal T2 (second terminal) which is connected with a DC power source (first power source) and the N-turn annular balanced side inductor 402b (second inductor) which is provided with the terminal T3 (third terminal) which outputs the positive signal, the terminal T4 (fourth terminal) which outputs the negative signal, and the terminal T5 (fifth terminal) which is connected with a DC power source (second power source) and being in a shape along a portion of the unbalanced side inductor 402a (first inductor) and that converts the input signal into the positive signal and the negative signal.

Note that other circuit elements such as a capacitor, an inductor, and a resistance are connected with the unbalanced side inductor 402a and/or the balanced side inductor 402b of the transformer type balun 402, and an input matching circuit may be configured. Accordingly, the degree of freedom of design of the transformer type balun 402 may be enhanced.

Examples of the transformer type balun 402 will be described later.

A gate terminal of the transistor 403 is connected with the terminal T3 of the balanced side inductor 402b. Further, the positive phase signal is input from the transformer type balun 402 to the gate terminal of the transistor 403. A source terminal of the transistor 403 is connected with the ground (GND) and is supplied with a voltage of 0 V. Note that the source terminal of the transistor 403 may be connected with a DC power source that supplies another voltage than 0 V. A drain terminal of the transistor 403 is connected with the output matching circuit 407.

A gate terminal of the transistor 404 is connected with the terminal T4 of the balanced side inductor 402b. Further, the negative phase signal is input from the transformer type balun 402 to the gate terminal of the transistor 404. A source terminal of the transistor 404 is connected with the ground (GND) and is supplied with a voltage of 0 V. Note that the source terminal of the transistor 404 may be connected with a DC power source that supplies another voltage than 0 V. A drain terminal of the transistor 404 is connected with the output matching circuit 407.

The impedance circuit 405 has at least a capacitor and is connected between the gate terminal of the transistor 403 and the drain terminal of the transistor 404. Further, the impedance circuit 405 causes a regular amount of signal to return from the drain terminal of the transistor 404 to the gate terminal of the transistor 403. The impedance circuit 405 has an impedance value Zx.

The impedance circuit 406 has at least a capacitor and is connected between the gate terminal of the transistor 404 and the drain terminal of the transistor 403. Further, the impedance circuit 406 causes a regular amount of signal to return from the drain terminal of the transistor 403 to the gate terminal of the transistor 404. The impedance circuit 406 has the impedance value Zx.

Note that the impedance circuit 405 and the impedance circuit 406 may be in a configuration in which the capacitor and the resistance are connected in series.

A power source voltage Vdd is supplied to the output matching circuit 407. Further, the output matching circuit 407 performs matching of signals that are acquired from the drain terminal of the transistor 403 and the drain terminal of the transistor 404, outputs a signal from the output terminal $T_{outp}$, and outputs the signal in the opposite phase to the output signal of the output terminal $T_{outp}$ from the output terminal $T_{outn}$. The output signal that is output from the output terminal $T_{outp}$ and the output signal that is output from the output terminal $T_{outn}$ are used as divided signals of two systems.

The output matching circuit 407 performs conversion such that the impedance of the transistor 403 based on the drain terminal of the transistor 403 as a reference and the impedance of the transistor 404 based on the drain terminal of the transistor 404 as a reference become respective desired impedances, for example. Further, the output matching circuit 407 converts the impedances of the drain terminal of the transistor 403 and the drain terminal of the transistor 404 such that the impedance of the input terminal $T_{in}$ becomes equivalent to the impedance of the output terminal $T_{outp}$ and the impedance of the output terminal $T_{outn}$, for example.

As described above, the power amplification division circuit 401 illustrated in FIG. 4 includes the transformer type balun 402 (conversion element), the transistor 403 (first transistor) in which the source is connected with the DC power source (third power source) and the positive phase signal is input to the gate, the transistor 404 (second transistor) in which the source is connected with the DC power source (fourth power source) and the negative phase signal is input to the gate, the impedance circuit 405 (first impedance circuit) that is connected between the gate of the transistor 403 and the drain of the transistor 404, the impedance circuit 406 (second impedance circuit) that is connected between the gate of the transistor 404 and the drain of the transistor 403, and the output matching circuit 407 that is connected with the drain of the transistor 403 and the drain of the transistor 404 and outputs the output signal (first divided signal) and the output signal (second divided signal) in the opposite phase to the first divided signal respectively from the output terminal $T_{outp}$ (first output terminal) and the output terminal $T_{outn}$ (second output terminal). Further, the power amplification division circuit 401 amplifies the input signal that is input from the input terminal $T_{in}$ and outputs the output signals in different phases respectively from the output terminal $T_{outp}$ and the output terminal $T_{outn}$.

The power amplification division circuit 401 illustrated in FIG. 4 may increase the number of systems for divisions by connecting the input terminal $T_{in}$ of another power amplification division circuit 401 with the output terminal $T_{outp}$ and/or the output terminal $T_{outn}$. A description will be made about such a configuration by using FIG. 5.

Figure 5:
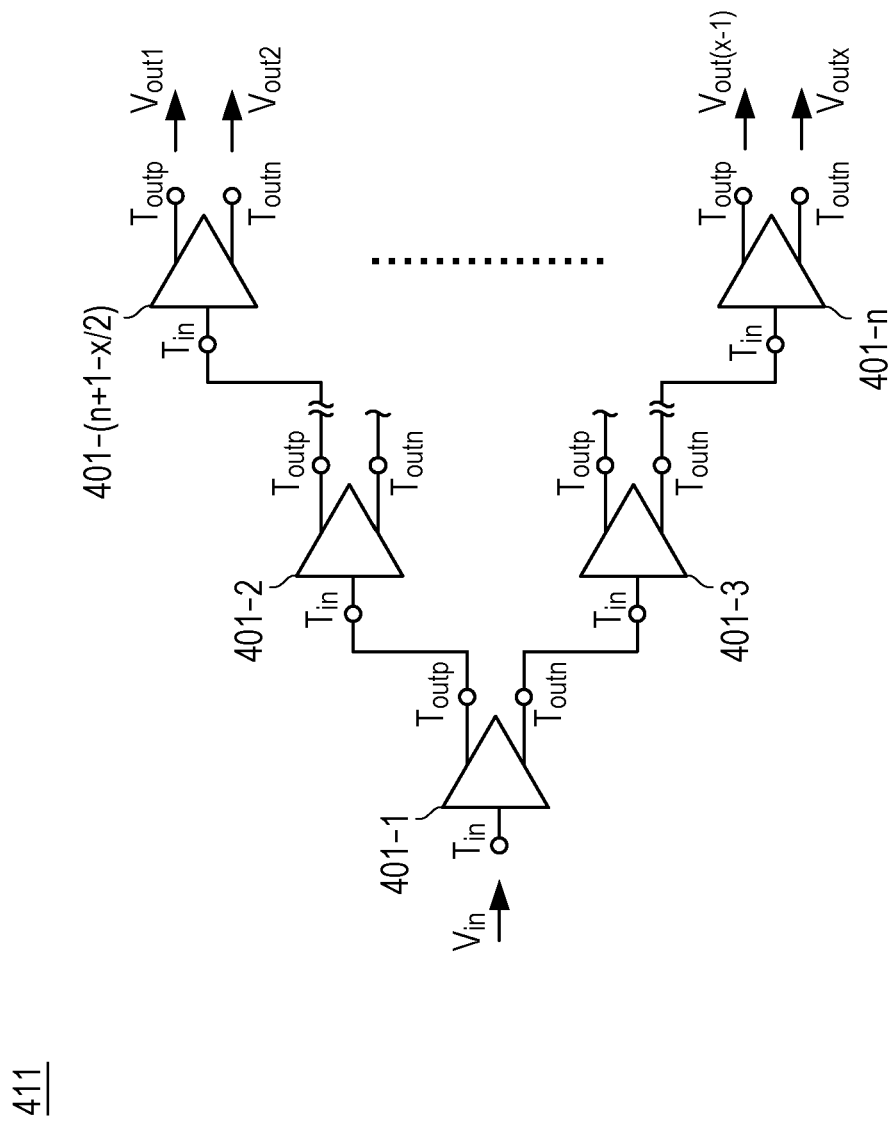
FIG. 5 is a circuit diagram that illustrates a configuration example of the power amplification division circuit according to the first embodiment of the present disclosure.

FIG. 5 is a circuit diagram that illustrates a configuration example of a power amplification division circuit 411 according to the first embodiment. An input signal $V_{in}$ is input to the power amplification division circuit 411. Further, the power amplification division circuit 411 outputs output signals of x systems (an output signal $V_{out1}$ to an output signal $V_{outx}$ (x is an even number that is two or greater)). That is, the power amplification division circuit 411 divides the input signal of one system into the output signals of x systems.

The power amplification division circuit 411 illustrated in FIG. 5 has plural power amplification division circuits 401 (a power amplification division circuit 401-1 to a power amplification division circuit 401-n). Further, the power amplification division circuit 411 has a multi-stage type configuration in which the power amplification division circuits 401 are connected through plural stages. In the following, the power amplification division circuits 401 of the power amplification division circuit 411 will be described sequentially as the first stage, the second stage, and so forth from the closer stage to the input side.

Specifically, the input signal $V_{in}$ is input to the input terminal $T_{in}$ of the first stage power amplification division circuit 401-1. Further, the output terminal $T_{outp}$ of the power amplification division circuit 401-1 is connected with the input terminal $T_{in}$ of the second stage power amplification division circuit 401-2, and the output terminal $T_{outn}$ of the power amplification division circuit 401-1 is connected with the input terminal $T_{in}$ of the second stage power amplification division circuit 401-3. The input terminals $T_{in}$ of the third stage and subsequent stage power amplification division circuits 401 are similarly and respectively connected with the output terminals $T_{outp}$ or the output terminals $T_{outn}$ of the previous stage power amplification division circuit 401.

That is, the power amplification division circuit 411 is a multi-stage type power amplification division circuit in which plural power amplification division circuits 401 (401-1 to 401-n) are connected. The output terminal $T_{outp}$ (first output terminal) of the power amplification division circuit 401-1 (first power amplification division circuit) is connected with the input terminal $T_{in}$ of the power amplification division circuit 401-2 (second power amplification division circuit), and the output terminal $T_{outn}$ (second output terminal) of the power amplification division circuit 401-1 is connected with the input terminal $T_{in}$ of the power amplification division circuit 401-3 (third power amplification division circuit). Further, the power amplification division circuit 411 outputs the divided signals of x systems from the output terminals $T_{outp}$ and the output terminals $T_{outn}$ of power amplification division circuits 401-(n+1−x/2) to 401-n (that is, x output terminals that are not connected with the input terminals $T_{in}$ of other power amplification division circuits 401).

By the configuration illustrated in FIG. 5, the power amplification division circuit 411 divides the input signal into the output signals of the desired number of systems.

Because the divider circuit such as the Wilkinson power divider circuit (see FIG. 1) may be omitted by this configuration, amplification and division of power become possible with a small size and low loss. Further, because the balun that converts the differential signals into the single-phase signal may be omitted on the output side (for example, the output terminal $T_{outp}$ and the output terminal $T_{outn}$ of the power amplification division circuit 401-1), the phase errors $\theta_a$ and $\theta_b$ that are expressed in the formula (5) and formula (6) may be made small. As a result, the degree of freedom of design of the transformer type balun 402 on the input side is enhanced, and the power amplification division circuit that has the balun with the optimal power amplification factor may be realized.

Note that in FIG. 5, an example is illustrated where the number of power amplification division circuits 401 of each stage is the same as the numbers of output terminals $T_{outp}$ and output terminals $T_{outn}$ of the previous stage power amplification division circuit 401. However, the number of power amplification division circuits 401 of each stage may not be the same as the numbers of output terminals $T_{outp}$ and output terminals $T_{outn}$ of the previous stage power amplification division circuit 401.

Further, an example is described where in each stage, the power amplification division circuit 401 is connected with the output terminal $T_{outp}$ and/or the output terminal $T_{outn}$ of the previous stage power amplification division circuit 401. However, the present disclosure is not limited to this. The balun (for example, the transformer type balun) may be connected with the output terminal $T_{outp}$ and/or the output terminal $T_{outn}$ of the previous stage power amplification division circuit 401. The balun is connected instead of the power amplification division circuit 401, the power consumption of the whole circuit may thereby be reduced in a case where the power amplification may be omitted.

Next, a description will be made about the characteristic of the amplification factor of the power amplification division circuit 401 according to this embodiment, which is illustrated in FIG. 4, by using FIG. 6A and FIG. 6B.

Figure 6A:
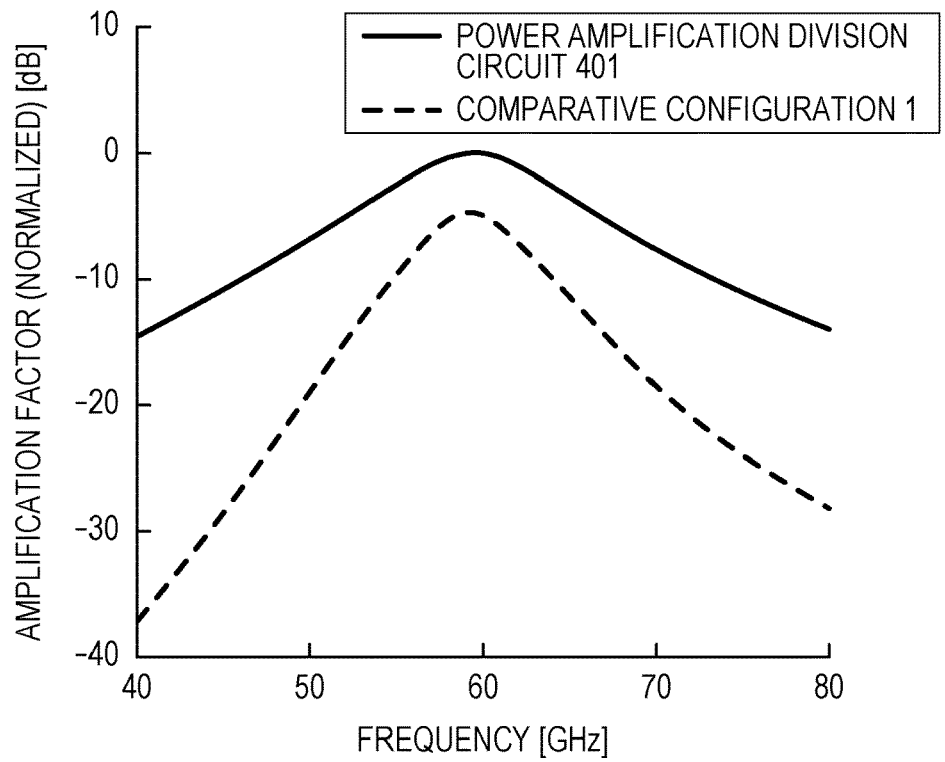
FIG. 6A is a diagram that illustrates a first example of a characteristic comparison of the power amplification division circuit according to the first embodiment of the present disclosure.

FIG. 6A is a diagram that illustrates a first example of a characteristic comparison of the power amplification division circuit 401 according to the first embodiment. FIG. 6A illustrates the characteristic of the power amplification division circuit 401 that is designed to operate in a 60 GHz band. As for the characteristic illustrated in FIG. 6A, as one example, the turn ratio of the transformer type balun 402 of the power amplification division circuit 401 is set as one to two.

In FIG. 6A, the horizontal axis represents the frequency of the signal that is input and output. Further, the vertical axis of FIG. 6A represents the amplification factor, which is normalized by using the maximum amplification factor of the power amplification division circuit 401 which is indicated by the solid line in FIG. 6A, by decibel (dB). In this case, the maximum amplification factor of the power amplification division circuit 401 that is indicated by the solid line in FIG. 6A is 0 dB.

A comparative configuration 1 in FIG. 6A is a configuration in which both of an input terminal and an output terminal of a power amplification division circuit are provided with the one-turn transformer type baluns 300 illustrated in FIG. 3A and FIG. 3B. Specifically, the comparative configuration 1 is a configuration in which the transformer type balun 402 in the power amplification division circuit 401 illustrated in FIG. 4 is substituted by a one-turn transformer type balun (for example, the one-turn transformer type balun 300 illustrated in FIG. 3A and FIG. 3B) and instead of the output matching circuit 407 in the power amplification division circuit 401, a one-turn transformer type balun which converts the differential signals output from the drain terminal of the transistor 403 and the drain terminal of the transistor 404 into the single-phase signal is connected as a matching circuit.

The characteristic of the amplification factor of the power amplification division circuit 401 that has the transformer type balun 402 whose turn ratio is one to two, which is illustrated in FIG. 6A, exhibits a better characteristic than the comparative configuration 1 at all frequencies from 40 to 80 GHz.

Figure 6B:
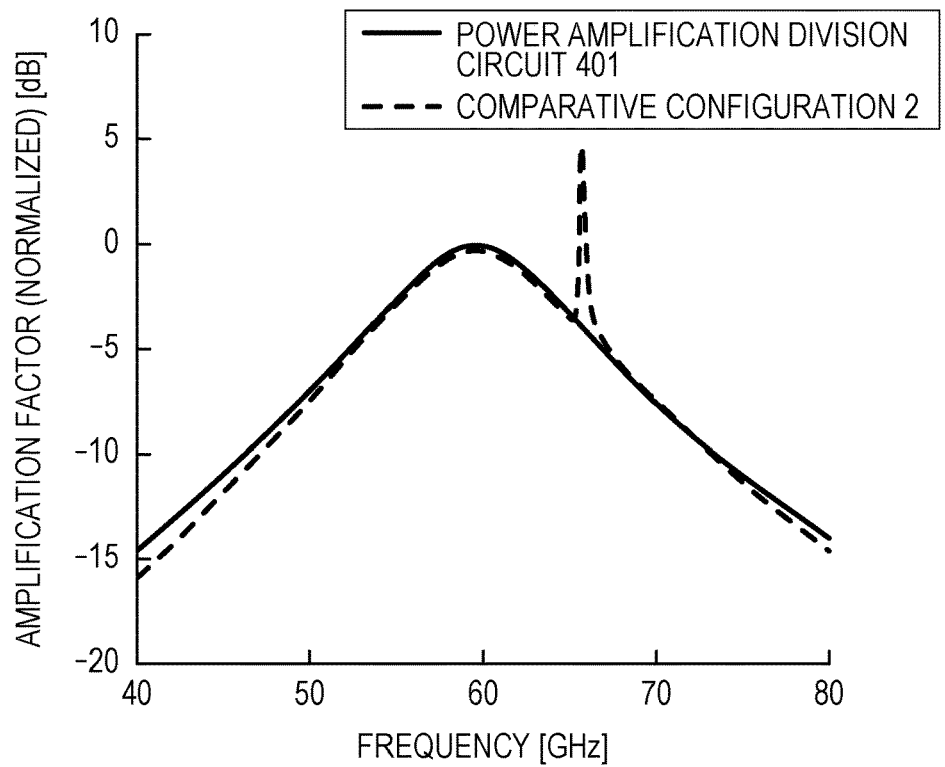
FIG. 6B is a diagram that illustrates a second example of the characteristic comparison of the power amplification division circuit according to the first embodiment of the present disclosure.

FIG. 6B is a diagram that illustrates a second example of the characteristic comparison of the power amplification division circuit 401 according to the first embodiment. FIG. 6B illustrates the characteristic of the power amplification division circuit 401 that is designed to operate in the 60 GHz band. In FIG. 6B, as one example, the turn ratio of the transformer type balun 402 of the power amplification division circuit 401 is set as one to two.

In FIG. 6B, the horizontal axis represents the frequency of the signal that is input and output. Further, the vertical axis of FIG. 6B represents the amplification factor, which is normalized by using the maximum amplification factor of the power amplification division circuit 401 which is indicated by the solid line in FIG. 6B, by decibel (dB). That is, the maximum amplification factor of the power amplification division circuit 401 that is indicated by the solid line in FIG. 6B is 0 dB.

A comparative configuration 2 in FIG. 6B is a configuration in which both of the input terminal and the output terminal of the power amplification division circuit are provided with the transformer type baluns whose turn ratio is one to two.

The characteristic of the amplification factor of the comparative configuration 2, which is illustrated in FIG. 6B, temporarily rises at a frequency near 65.7 GHz. This temporary rise of the amplification factor occurs because the comparative configuration 2 oscillates at a frequency near 65.7 GHz. On the other hand, the temporary rise does not occur to the characteristic of the power amplification division circuit 401. That is, the power amplification division circuit 401 may regulate oscillation and achieve the optimal amplification factor.

Next, a description will be made about a first configuration example of the transformer type balun 402 by using FIG. 7A and FIG. 7B.

Figure 7A:
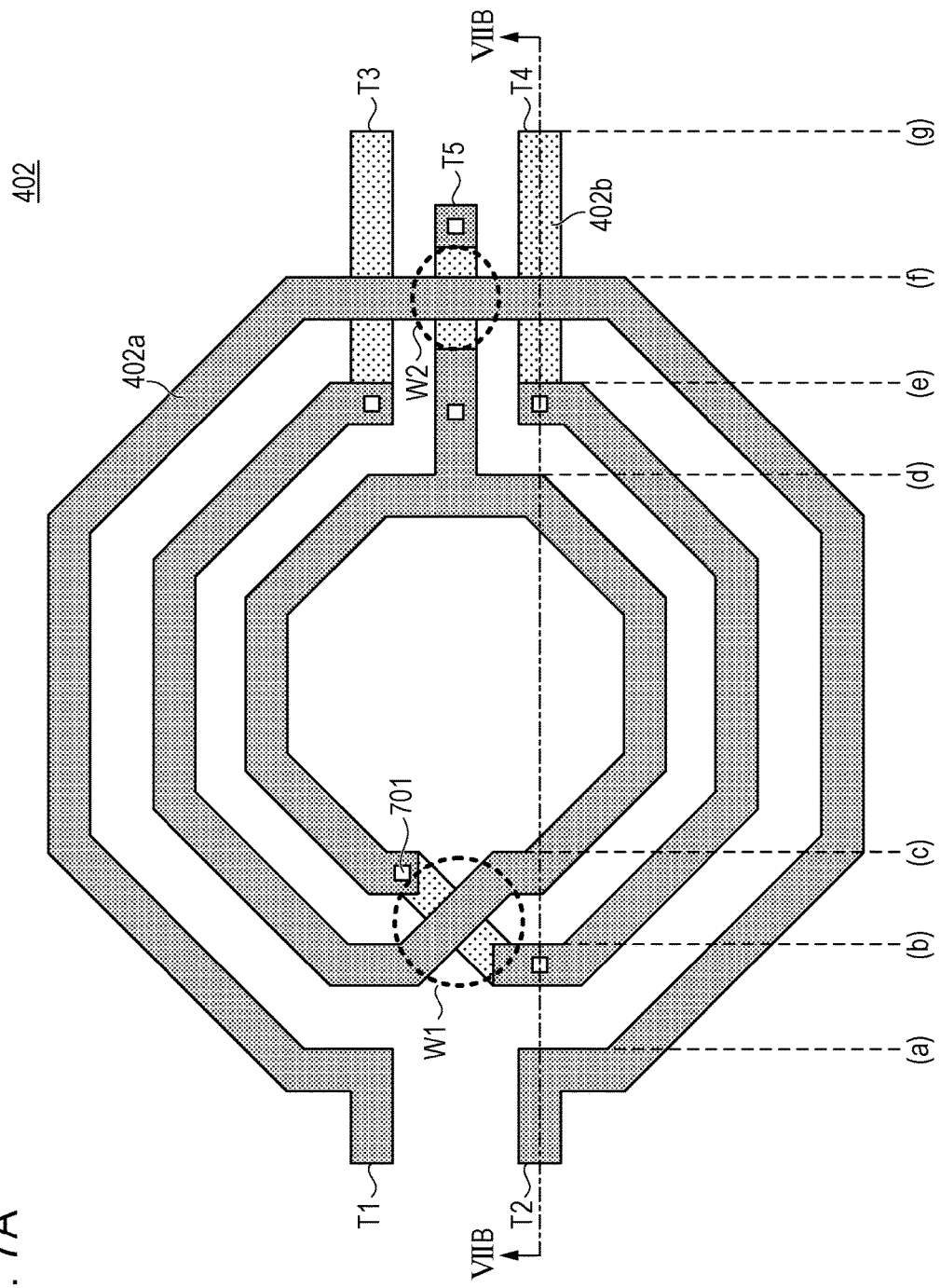
FIG. 7A is a plan diagram that illustrates a first configuration example of a transformer type balun whose turn ratio is one to two.

FIG. 7A is a plan diagram that illustrates the first configuration example of the transformer type balun 402 whose turn ratio is one to two. FIG. 7B is a cross-sectional diagram taken along line VIIB-VIIB in FIG. 7A.(a) to (g) in FIG. 7B respectively correspond to (a) to (g) in FIG. 7A. Further, in FIG. 7A and FIG. 7B, the same reference characters are given to the configurations that are similar to FIG. 4.

In a process of a semiconductor, plural metal layers are formed. Further, the metal layers may have different thicknesses. For example, in a three-layer structure that is formed of a first layer, a second layer, and a third layer, even in a case where the thickness of the first layer is the same as the thickness of the second layer, the thickness of the first layer may be different from the thickness of the third layer.

The transformer type balun 402 is configured to have the desired number of turns by connecting wiring parts of annular inductors that are formed in different layers by vias.

Specifically, the unbalanced side inductor 402a is formed in the first layer that is the thickest metal layer. The first layer is a layer with the lowest resistance value. Further, as described above, the terminal T1 is connected with the input terminal $T_{in}$, and the terminal T2 is connected with the ground or the DC power source. Note that the terminal T2 may be connected with the input terminal $T_{in}$, and the terminal T1 may be connected with the ground or the DC power source.

As for the balanced side inductor 402b, a portion of wiring is formed in the first layer, and another portion of wiring is formed in the second layer that is positioned in a lower layer than the first layer. Specifically, in the portion in which pieces of wirings of the balanced side inductor 402b overlap with each other on a plane (frame W1 in FIG. 7A: hereinafter described as first crossed portion), one piece of wiring of the balanced side inductor 402b is formed in the second layer, and the other piece of wiring of the balanced side inductor 402b is formed in the first layer. A portion between wiring formed in the first layer of the balanced side inductor 402b and wiring formed in the second layer is connected by a via 701. In the first crossed portion, the wiring of the balanced side inductor 402b is brought down to the second layer as the lower layer via the via 701. In another portion than the first crossed portion, the wiring of the balanced side inductor 402b is brought up to the first layer via the via 701.

As described above, the terminal (center tap terminal) T5 is supplied with the DC power source, and the positive phase signal and the negative phase signal are respectively output from the terminal T3 and the terminal T4.

The minimum diameter of the unbalanced side inductor 402a is larger than the maximum diameter of the balanced side inductor 402b. In a planar view, the balanced side inductor 402b is formed on the inside of the unbalanced side inductor 402a.

Because the asymmetric capacitive coupling between the balanced side and the unbalanced side may be reduced by this configuration, the phase errors of the output differential signals may be lowered, and the degree of freedom of design may be enhanced.

Further, except the first crossed portion of the wiring, the wiring of the unbalanced side inductor 402a and the wiring of the balanced side inductor 402b are formed in the first layer with the lowest resistance value. Thus, the balun with low loss may be realized.

Figure 7B:
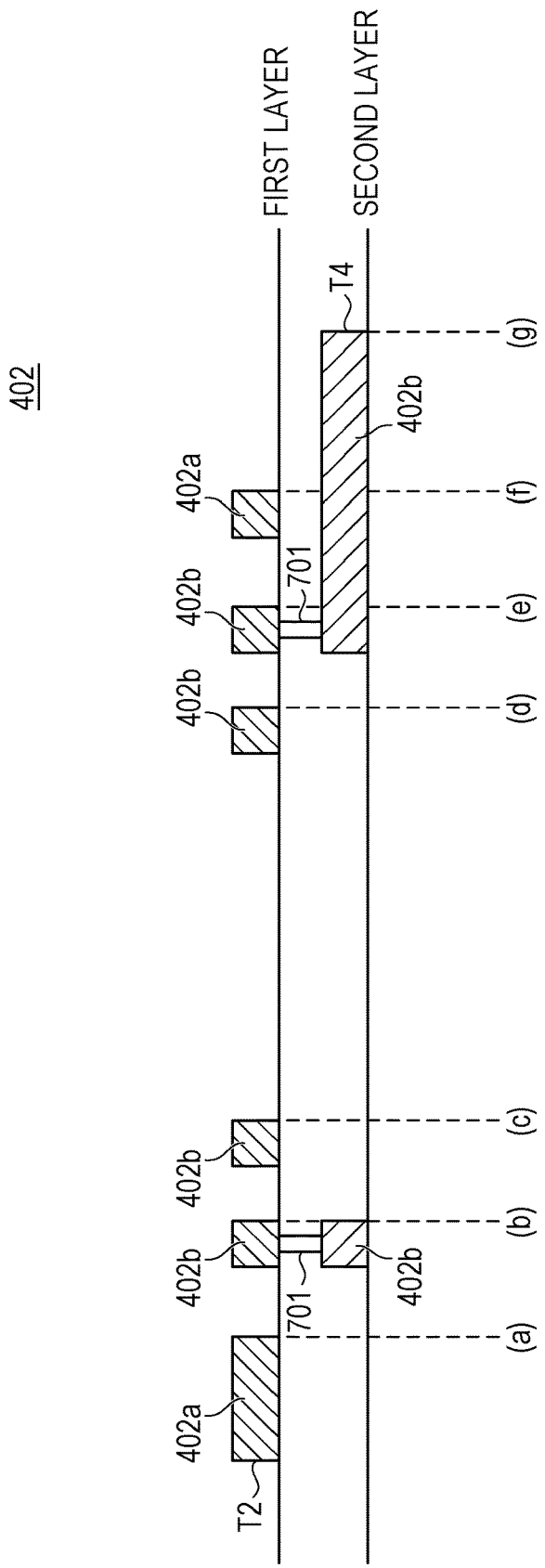
FIG. 7B is a cross-sectional diagram taken along line VIIB-VIIB in FIG. 7A.

Note that FIG. 7A and FIG. 7B illustrate an example where the wiring of one inductor is brought down to the second layer via the via 701 in the first crossed portion and is brought up to the first layer via the via 701 in the other portion than the first crossed portion. In the first crossed portion, the wiring of one inductor may be brought up to a higher layer than the first layer via the via.

Further, in a high-frequency wave band such as the millimeter-wave band, virtual ground in the connection point between the center tap terminal T5 and the balanced side inductor 402b is not sufficient. Thus, the power amplification division circuit 401 possibly oscillates due to an influence of the inductance of the center tap terminal T5. Accordingly, the wiring is formed as the thickest metal layer (the first layer in FIG. 7A and FIG. 7B) to the place where the distance between the center tap terminal T5 connected with the connection point and the wiring of the balanced side inductor 402b or the unbalanced side inductor 402a becomes the shortest pitch in the design rule, for example, and is brought down from the place to the second layer via the via 701. In another portion than a second crossed portion (frame W2 in FIG. 7A), the wiring is brought up to the first layer in the section where the distance between the wiring for the center tap terminal T5 in the first layer and the wiring of the balanced side inductor 402b or the unbalanced side inductor 402a becomes the shortest pitch in the design rule, for example.

Note that the center tap terminal T5 may be brought up from the first layer to an upper layer via the via in the second crossed portion and may be brought down to the first layer via the via in the other portion than the second crossed portion. Further, the center tap terminal T5 may be configured such that the center tap terminal T5 is stacked throughout all the layers and a crossed layer (the first layer in FIG. 7A and FIG. 7B) is taken off in another section than the second crossed section.

Next, a description will be made about a second configuration example of the transformer type balun 402 whose turn ratio is one to two by using FIG. 8A and FIG. 8B.

Figure 8A:
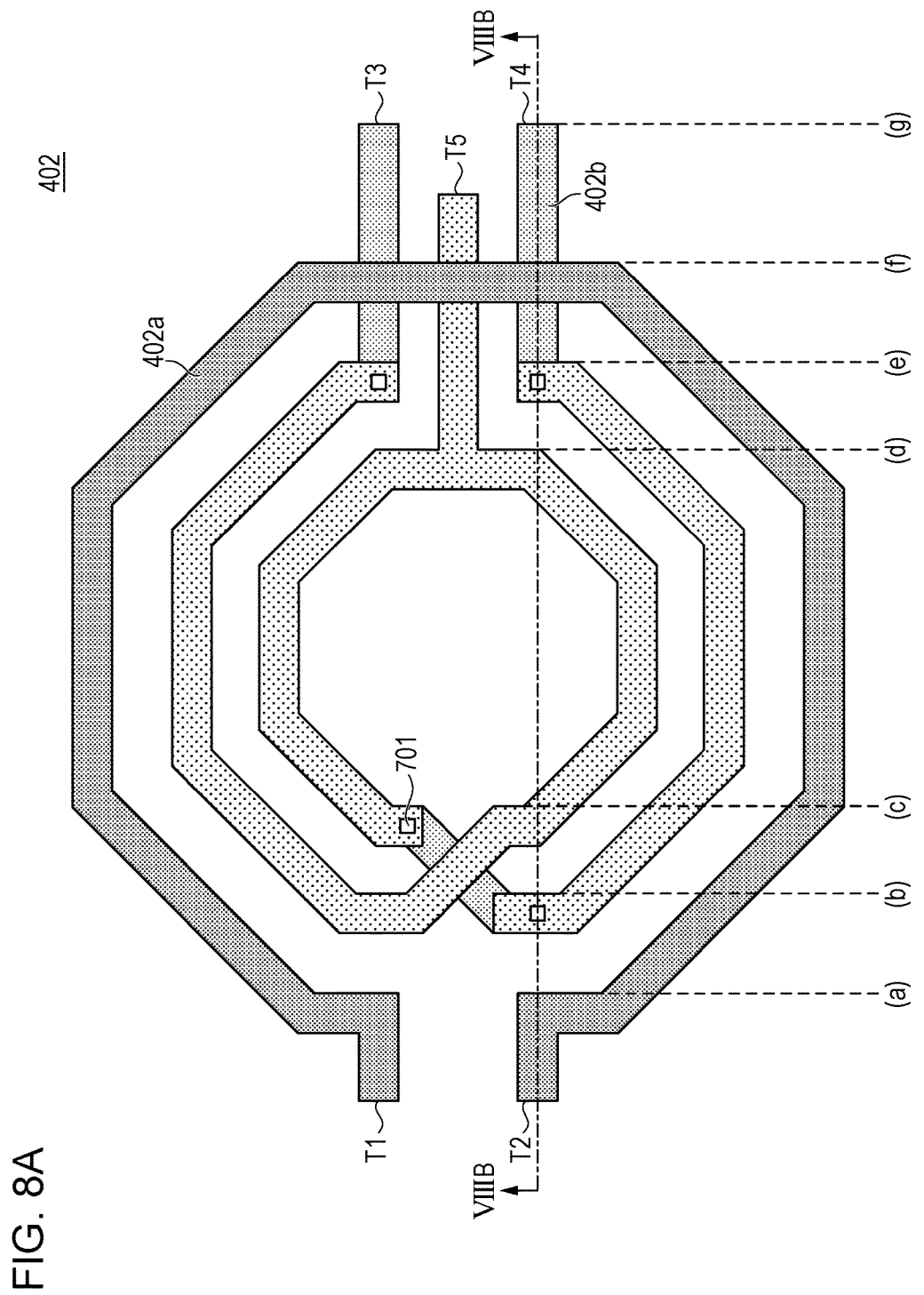
FIG. 8A is a plan diagram that illustrates a second configuration example of the transformer type balun whose turn ratio is one to two.

FIG. 8A is a plan diagram that illustrates the second configuration example of the transformer type balun 402 whose turn ratio is one to two. FIG. 8B is a cross-sectional diagram taken along line VIIIB-VIIIB in FIG. 8A.(*a*) to (*g*) in FIG. 8B respectively correspond to (*a*) to (*g*) in FIG. 8A. Further, in FIG. 8A and FIG. 8B, the same reference characters are given to the configurations that are similar to FIG. 4.

The difference point between the configuration illustrated in FIG. 8A and FIG. 8B and the configuration illustrated in FIG. 7A and FIG. 7B is the point that the layer in which the wiring of the balanced side inductor 402*b* is formed is different.

Specifically, in FIG. 7A and FIG. 7B, the wiring of the balanced side inductor 402*b* that is formed in the first layer is formed in the second layer in FIG. 8A and FIG. 8B. Further, the wiring of the balanced side inductor 402*b* that is formed in the second layer in FIG. 7A and FIG. 7B is formed in the third layer in FIG. 8A and FIG. 8B.

Note that the order of the layers is reversed, for example, the wiring of the balanced side inductor 402*b* that is formed in the first layer in FIG. 7A and FIG. 7B may thereby be formed in the third layer, and the wiring of the balanced side inductor 402*b* that is formed in the second layer may be formed in the second layer.

Consequently, because the degree of freedom of the relationship between the diameter of the unbalanced side inductor 402*a* and the balanced side inductor 402*b* is enhanced, more flexible design may be performed.

As describe above, in the power amplification division circuit 401 according to the first embodiment, the transformer type balun that converts the signal of one system into the differential signals is provided on the input side of the differential amplifier circuit, and the differential amplifier circuit amplifies the differential signals that are output from the transformer type balun and outputs the amplified differential signals as the divided signals of two systems.

Consequently, because provision of the transformer type balun in the output of the differential amplifier circuit may be omitted and the divided signals may be output, the power of the signal may be amplified with high efficiency and divided into plural systems. Further, enlargement of the circuit size may be regulated, and a small-sized power amplification division circuit may be realized.

Second Embodiment

In this second embodiment, an example will be described where a configuration that controls the phases of the divided signals is provided to the output of the power amplification division circuit described in the first embodiment.

Figure 9:
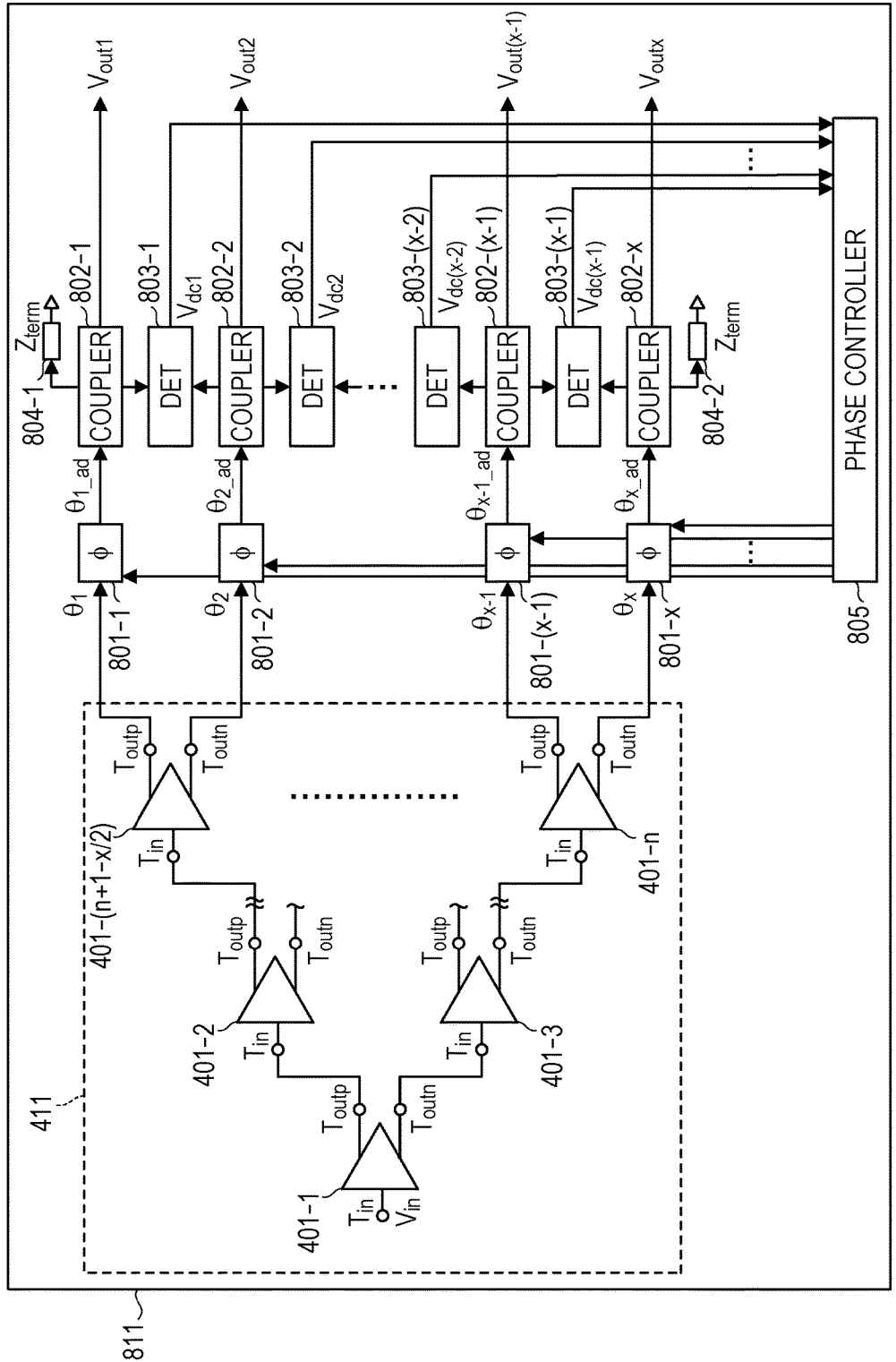
FIG. 9 is a diagram that illustrates a configuration example of a power amplification division circuit according to a second embodiment of the present disclosure.

FIG. 9 is a diagram that illustrates a configuration example of a power amplification division circuit 811 according to the second embodiment. Note that in FIG. 9, the same reference characters are given to similar configurations to FIG. 4 and FIG. 5, and a description thereof will not be made.

The power amplification division circuit 811 illustrated in FIG. 9 is provided with phase shifters (ϕ) 801-1 to 801-*x*, directional couplers 802-1 to 802-*x*, detectors (DET) 803-1 to 803-(x−1), terminal ends ($Z_{term}$) 804-1 and 804-2, and a phase controller 805 on the output side of the power amplification division circuit 411 illustrated in FIG. 5.

Note that in the following, a description will be made while the phases of the output signals of x systems that are output from the power amplification division circuit 411 are denoted as $\theta_1$ to $\theta_x$.

The phase shifter 801-*i* (i is an integer that is one or greater but x or smaller) acquires a control signal that indicates the phase amount to be adjusted (phase adjustment amount $\Delta\theta_i$) from the phase controller 805. Then, the phase shifter 801-*i* adjusts a phase $\theta_i$ of the output signal of the ith system that is output from the power amplification division circuit 411 to a phase $\theta_{i\_ad}$ based on the control signal. Here, $\theta_{i\_ad}=\theta_i+\Delta\theta_i$. Then, the phase shifter 801-*i* outputs the signal of the ith system in the adjusted phase to the directional coupler 802-*i*.

The directional coupler 802-*i* has one input port and three output ports and branches and outputs the signal that is acquired from the input port to the three output ports.

The directional coupler 802-1 outputs the signal of the first system in the adjusted phase, which is acquired from the phase shifter 801-1, to the terminal end 804-1 and the detector 803-1. Further, the signal of the first system in the adjusted phase is output to a signal processing unit (not illustrated) that performs frequency conversion and a demodulation process, for example, as an output signal $V_{out1}$ from the remaining output port of the directional coupler 802-1.

The directional coupler 802-*j* outputs the signal of the jth system in the adjusted phase, which is acquired from the phase shifter 801-*j*, to the detector 803-(*j*−1) and the detector 803-*j*. Further, the signal of the jth system in the adjusted phase is output to the signal processing unit (not illustrated) that performs frequency conversion and the demodulation process, for example, as an output signal $V_{outj}$ from one remaining output port of the directional coupler 802-*j*.

The directional coupler 802-*x* outputs the signal of the xth system in the adjusted phase, which is acquired from the phase shifter 801-*x*, to the detector 803-(*x*−1) and the terminal end 804-2. Further, the signal of the xth system in the adjusted phase is output to the signal processing unit (not illustrated) that performs frequency conversion and the demodulation process, for example, as an output signal $V_{outx}$ from one remaining output port of the directional coupler 802-*x*.

The detector 803-*k* (k is an integer that is one or greater but x−1 or smaller) calculates the phase difference between the signal of the kth system in the adjusted phase, which is acquired from the directional coupler 802-*k*, and the signal of the k+1th system in the adjusted phase, which is acquired from the directional coupler 802-(*k*+1), and outputs a signal $V_{dck}$ that indicates the calculated phase difference to the phase controller 805. Note that configuration examples of the detectors 803-1 to 803-(*j*−1) will be described later.

The terminal end 804-1 is provided in order to enhance the operation precision of the directional coupler 802-1. The terminal end 804-1 terminates the signal of the first system in the adjusted phase, which is output from the directional coupler 802-1.

The terminal end 804-2 is provided in order to enhance the operation precision of the directional coupler 802-*x*. The terminal end 804-2 terminates the signal of the xth system in the adjusted phase, which is output from the directional coupler 802-*x*.

The phase controller 805 assesses the phase amounts to be adjusted (phase adjustment amounts $\Delta\theta_1$ to $\Delta\theta_x$) in the phase shifters 801-1 to 801-*x* based on the signals $V_{dc1}$ to $V_{dc(x-1)}$ that are respectively output from the detectors 803-1 to 803-(x−1) and outputs control signals that indicate the phase adjustment amounts.

Note that details of a phase control method will be described later.

Next, the configurations of the detectors 803-1 to 803-(j−1) will be described while the detector 803-k is raised as an example.

Figure 10:
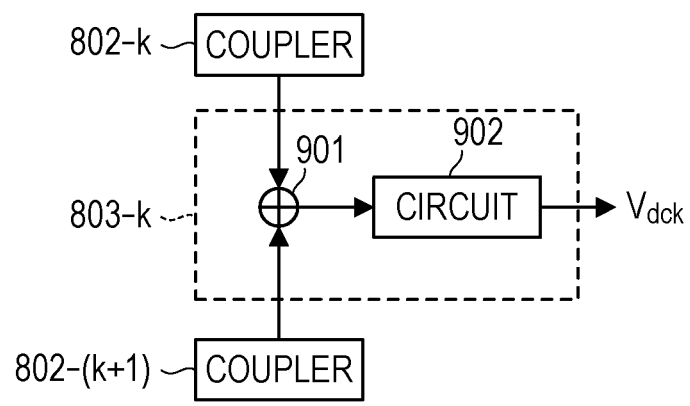
FIG. 10 is a diagram that illustrates a first example of a configuration of a detector in the second embodiment of the present disclosure.

FIG. 10 is a diagram that illustrates a first example of the configuration of the detector 803-k in the second embodiment. The detector 803-k has an adder 901 and a nonlinear circuit 902.

The adder 901 adds the signal of the kth system in the adjusted phase, which is output from the directional coupler 802-k, and the signal of the k+1th system in the adjusted phase, which is output from the directional coupler 802-(k+1). The adder 901 outputs the signal resulting from the addition to the nonlinear circuit 902.

The nonlinear circuit 902 uses the secondary distortion of the signal resulting from the addition to calculate the direct current component signal $V_{dck}$ that indicates the phase difference between the signal of the kth system in the adjusted phase and the signal of the k+1th system in the adjusted phase and outputs the direct current component signal $V_{dck}$ to the phase controller 805 (see FIG. 9).

Specifically, in a case where the signal of the kth system in the adjusted phase and the signal of the k+1th system in the adjusted phase are signals in the same phase (that is, the phase difference is zero), the amplitude of the signal resulting from the addition in the adder 901 becomes the maximum, and $V_{dck}$ that is calculated from the secondary distortion thereof thus becomes the maximum.

On the other hand, in a case where the signal of the kth system in the adjusted phase and the signal of the k+1th system in the adjusted phase are signals in the opposite phases (that is, the phase difference is 180°), the amplitude of the signal resulting from the addition in the adder 901 becomes the minimum, and $V_{dck}$ that is calculated from the secondary distortion thereof thus becomes the minimum.

The case where the signal of the kth system in the adjusted phase and the signal of the k+1th system in the adjusted phase are the signals in the opposite phases is equivalent to a fact that the amplitude of the signal resulting from the addition in the adder 901 is zero and the signal that is input to the nonlinear circuit 902 is also zero. In such a case, the nonlinear circuit 902 outputs a regular bias voltage $V_{sta}$ as the direct current component signal $V_{dck}$.

That is, in a case where the signal of the kth system in the adjusted phase and the signal of the k+1th system in the adjusted phase are the signals in the same phase (that is, the phase difference is zero), $V_{dck}$−$V_{sta}$ becomes the maximum. In a case where the signal of the kth system in the adjusted phase and the signal of the k+1th system in the adjusted phase are the signals in the opposite phases (that is, the phase difference is 180°), $V_{dck}$−$V_{sta}$ becomes zero.

Figure 11:
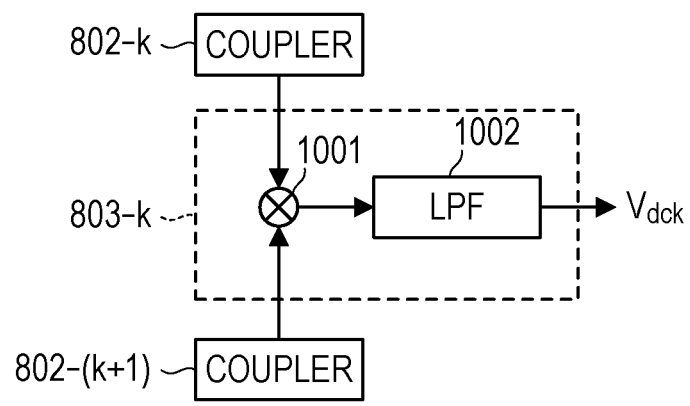
FIG. 11 is a diagram that illustrates a second example of the configuration of the detector in the second embodiment of the present disclosure.

FIG. 11 is a diagram that illustrates a second example of the configuration of the detector 803-k in the second embodiment. The detector 803-k has a multiplier 1001 and a low-pass filter (hereinafter described as LPF) 1002.

The multiplier 1001 multiplies the signal of the kth system in the adjusted phase, which is output from the directional coupler 802-k, by the signal of the k+1th system in the adjusted phase, which is output from the directional coupler 802-(k+1). The multiplier 1001 outputs the signal resulting from the multiplication to the LPF 1002. The signal resulting from the multiplication includes a direct current component and harmonic components of the frequency of the signal in the adjusted phase.

The LPF 1002 removes the harmonic components that are included in the multiplication signal output from the multiplier 1001 and outputs the direct current component. Then, the LPF 1002 outputs the signal $V_{dck}$ that results from addition of the regular bias voltage $V_{sta}$ to the calculated direct current component to the phase controller 805 (FIG. 9).

Specifically, in a case where the signal of the kth system in the adjusted phase and the signal of the k+1th system in the adjusted phase are the signals in the same phase (that is, the phase difference is zero), the direct current component of the signal resulting from the multiplication in the multiplier 1001 becomes the maximum, and the calculated $V_{dck}$ thus becomes the maximum.

In a case where the signal of the kth system in the adjusted phase and the signal of the k+1th system in the adjusted phase are the signals in the opposite phases (that is, the phase difference is 180°), the direct current component of the signal resulting from the multiplication in the multiplier 1001 becomes the minimum, and the calculated $V_{dck}$ thus becomes the minimum.

In a case where the phase difference between the signal of the kth system in the adjusted phase and the signal of the k+1th system in the adjusted phase is 90° or 270°, the direct current component of the signal resulting from the multiplication in the multiplier 1001 becomes zero, and the calculated $V_{dck}$ thus becomes $V_{sta}$.

As described above, by the configuration of the detector 803-k illustrated in FIG. 10 or FIG. 11, the direct current component signal that indicates the phase difference between two signals input to each of the detectors is calculated and output to the phase controller 805.

Further, $V_{dck}$ that is output from the detector 803-k illustrated in FIG. 10 or FIG. 11 becomes the maximum in a case where the signal of the kth system in the adjusted phase and the signal of the k+1th system in the adjusted phase are the signals in the same phase (that is, the phase difference is zero) and becomes the minimum in a case where the signal of the kth system in the adjusted phase and the signal of the k+1th system in the adjusted phase are the signals in the opposite phases (that is, the phase difference is (180°).

In addition, $V_{dck}$ that is output from the detector 803-k illustrated in FIG. 11 becomes $V_{sta}$ that is the bias voltage in a case where the phase difference between the signal of the kth system in the adjusted phase and the signal of the k+1th system in the adjusted phase is 90° or 270°.

Note that FIG. 11 illustrates an example where the detector 803-k has the LPF 1002. However, the present disclosure is not limited to this. For example, the phase controller 805 has the LPF, and the LPF of the phase controller 805 may remove the harmonic components that are included in the signal output from the detector 803-k.

Next, a description will be made about the phase control method in the second embodiment. Note that in the following, a description will be made while a control method, in which the amount for fluctuating the phase of the output signal of the kth system (phase adjustment amount Δθ) is increased or decreased and the phases of the output signals of the kth system and the output signal of the k+1th system are thereby made the same phase, is raised as one example.

Figure 12:
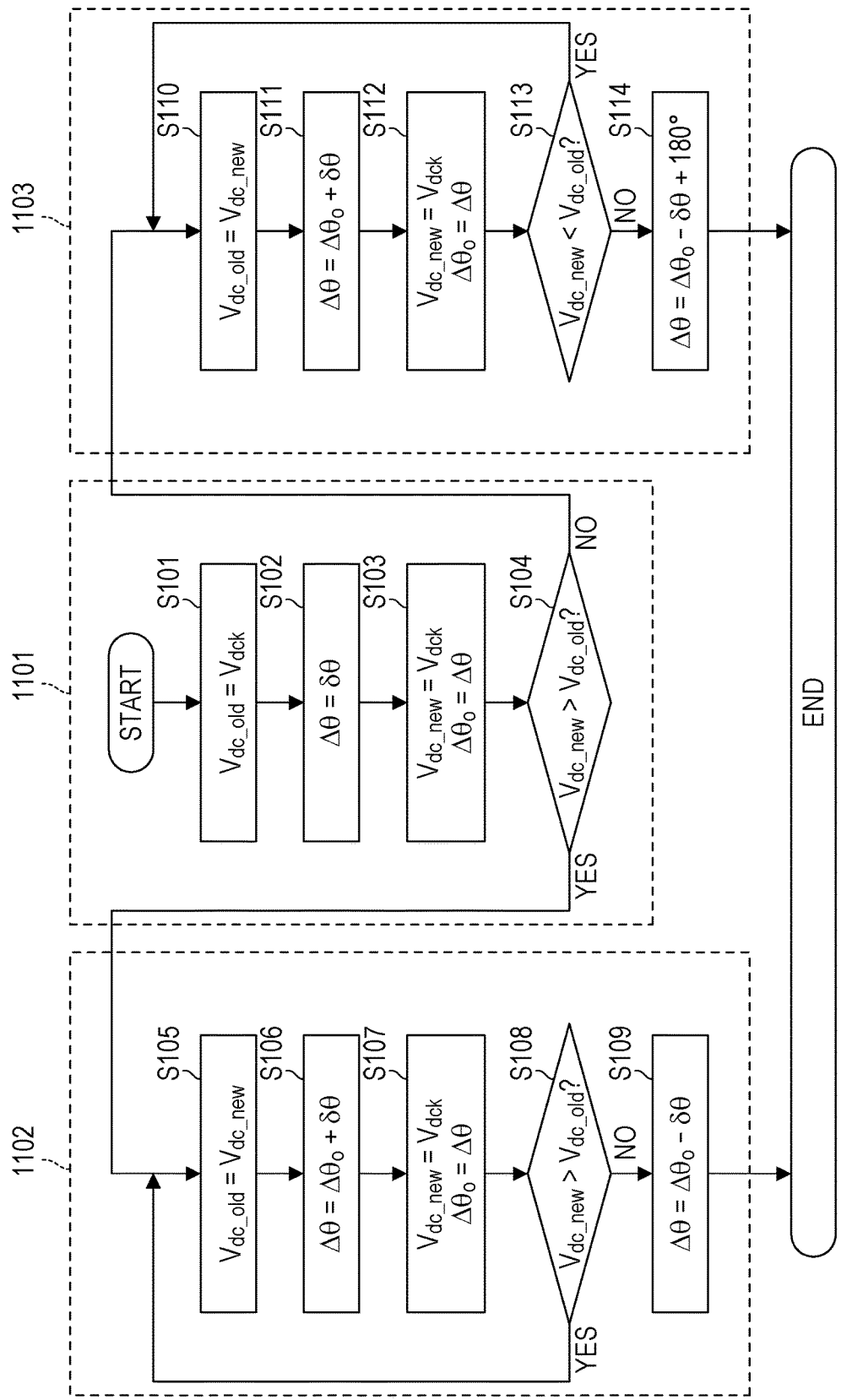
FIG. 12 is a flowchart that illustrates a first example of a phase control method in the second embodiment of the present disclosure.

FIG. 12 is a flowchart that illustrates a first example of the phase control method in the second embodiment. The flowchart illustrated in FIG. 12 is a flowchart based on the point that $V_{dck}$ that is output from the detector 803-k becomes the maximum in a case where the signal of the kth system in the adjusted phase and the signal of the k+1th system in the adjusted phase are the signals in the same phase (that is, the phase difference is zero) and becomes the minimum in a case where the signal of the kth system in the adjusted phase and the signal of the k+1th system in the adjusted phase are the signals in the opposite phases (that is, the phase difference is 180°). Thus, the flowchart illustrated in FIG. 12 is a flowchart in which the operation is possible in the configuration of the detector 803-$k$ in either one of FIG. 10 and FIG. 11.

After an initial flow 1101 is conducted, the flowchart illustrated in FIG. 12 moves to a second flow 1102 or a third flow 1103 in response to the assessment result in the initial flow 1101.

In step 101 (S101), the phase controller 805 retains $V_{dck}$ output from the detector 803-$k$ as a signal $V_{dc\_old}$ that indicates the phase difference at a time before the phase is adjusted in S102, which will be described later.

In S102, the phase controller 805 outputs a control signal that adjusts a phase $\theta_k$ of the output signal of the kth system by $\Delta\theta=\delta\theta$ to the phase shifter 801-$k$. The phase shifter 801-$k$ adjusts the output signal of the kth system by $\Delta\theta$ based on the control signal and outputs the signal of the kth system in the adjusted phase, which has a phase $\theta_{k\_ad}=\theta_k+\Delta\theta$.

In S103, the phase controller 805 retains $V_{dck}$ output from the detector 803-$k$ as a signal $V_{dc\_new}$ that indicates the phase difference resulting from the adjustment. Further, the phase controller 805 retains the phase adjustment amount $\Delta\theta$ at the present time point as $\Delta\theta_o$.

In S104, the phase controller 805 assesses whether or not $V_{dc\_new}$ is larger than $V_{dc\_old}$. In a case where $V_{dc\_new}$ is larger than $V_{dc\_old}$ (YES in S104), the flow moves to S105. In a case where $V_{dc\_new}$ is $V_{dc\_old}$ or smaller (NO in S104), the flow moves to S110.

In S105, the phase controller 805 retains $V_{dc\_new}$ as the signal $V_{dc\_old}$ that indicates the phase difference at a time before the phase is adjusted in S106, which will be described later.

In S106, the phase controller 805 outputs the control signal that adjusts the phase $\theta_k$ of the output signal of the kth system by $\Delta\theta=\Delta\theta_o+\delta\theta$ to the phase shifter 801-$k$. The phase shifter 801-$k$ adjusts the output signal of the kth system by $\Delta\theta$ based on the control signal and outputs the signal of the kth system in the adjusted phase, which has the phase $\theta_{k\_ad}=\theta_k+\Delta\theta$. That is, the phase shifter 801-$k$ adjusts the phase $\theta_{k\_ad}$ of the signal in the adjusted phase further by $\delta\theta$.

In S107, the phase controller 805 retains $V_{dck}$ output from the detector 803-$k$ as the signal $V_{dc\_new}$ that indicates the phase difference resulting from performance of the phase adjustment in S106. Further, the phase controller 805 retains the phase adjustment amount $\Delta\theta$ at the present time point as $\Gamma\theta_o$.

In S108, the phase controller 805 assesses whether or not $V_{dc\_new}$ is larger than $V_{dc\_old}$. In a case where $V_{dc\_new}$ is larger than $V_{dc\_old}$ (YES in S108), the flow returns to S105. In a case where $V_{dc\_new}$ is $V_{dc\_old}$ or smaller (NO in S108), the flow moves to S109.

In S109, the phase controller 805 outputs the control signal that adjusts the phase $\theta_k$ of the output signal of the kth system by $\Delta\theta=\Delta\theta_o-\delta\theta$ to the phase shifter 801-$k$. The phase shifter 801-$k$ adjusts the output signal of the kth system by $\Delta\theta$ based on the control signal and outputs the signal of the kth system in the adjusted phase, which has the phase $\theta_{k\_ad}=\theta_k+\Delta\theta$. Then, the flow finishes.

In a case where $V_{dc\_new}$ is $V_{dc\_old}$ or smaller (NO in S104), in S110, the phase controller 805 retains $V_{dc\_new}$ as the signal $V_{dc\_old}$ that indicates the phase difference at a time before the phase is adjusted in S111, which will be described later.

In S111, the phase controller 805 outputs the control signal that adjusts the phase $\theta_k$ of the output signal of the kth system by $\Delta\theta=\Delta\theta_o+\delta\theta$ to the phase shifter 801-$k$. The phase shifter 801-$k$ adjusts the output signal of the kth system by $\Delta\theta$ based on the control signal and outputs the signal of the kth system in the adjusted phase, which has the phase $\theta_{k\_ad}=\theta_k+\Delta\theta$. That is, the phase shifter 801-$k$ adjusts the phase $\theta_{k\_ad}$ of the signal in the adjusted phase further by $\delta\theta$.

In S112, the phase controller 805 retains $V_{dck}$ output from the detector 803-$k$ as the signal $V_{dc\_new}$ that indicates the phase difference resulting from performance of the phase adjustment in S111. Further, the phase controller 805 retains the phase adjustment amount $\Delta\theta$ at the present time point as $\Delta\theta_o$.

In S113, the phase controller 805 assesses whether or not $V_{dc\_new}$ is smaller than $V_{dc\_old}$. In a case where $V_{dc\_new}$ is smaller than $V_{dc\_old}$ (YES in S113), the flow returns to S110. In a case where $V_{dc\_new}$ is $V_{dc\_old}$ or larger (NO in S113), the flow moves to S114.

In S114, the phase controller 805 outputs the control signal that adjusts the phase $\theta_k$ of the output signal of the kth system by $\Delta\theta=\Delta\theta_o-\delta\theta+180°$ to the phase shifter 801-$k$. The phase shifter 801-$k$ adjusts the phase of the output signal of the kth system based on the control signal and outputs the signal of the kth system in the adjusted phase, which has the phase $\theta_{k\_ad}=\theta_k+\Delta\theta$. Then, the flow finishes.

As described above, $V_{dck}$ that is output from the detector 803-$k$ becomes the maximum in a case where the signal of the kth system in the adjusted phase and the signal of the k+1th system in the adjusted phase are the signals in the same phase (that is, the phase difference is zero) and becomes the minimum in a case where the signal of the kth system in the adjusted phase and the signal of the k+1th system in the adjusted phase are the signals in the opposite phases (that is, the phase difference is 180°).

Based on the phase difference and the magnitude relationship with respect to $V_{dck}$, the phase control method illustrated in FIG. 12 adjusts the phase by $\Delta\theta$ in S102 of the initial flow 1101 and compares $V_{dc\_new}$ that indicates the phase difference resulting from the phase adjustment with $V_{dc\_old}$ that indicates the phase difference at a time before the phase adjustment in S104.

Further, a case where $V_{dc\_new}$ is larger than $V_{dc\_old}$ (YES in S104) indicates that the phase adjustment in S102 is the phase adjustment in the direction in which $V_{dck}$ becomes large, that is, in the direction in which the phase difference approaches zero. Thus, in the second flow 1102, until $V_{dck}$ becomes the maximum, that is, the phase difference becomes zero, the phase adjustment amount $\Delta\theta$ is stepwise increased by $\delta\theta$.

On the other hand, a case where $V_{dc\_new}$ is $V_{dc\_old}$ or smaller (NO in S104) indicates that the phase adjustment in S102 is the phase adjustment in the direction in which $V_{dck}$ becomes small, that is, in the direction in which the phase difference becomes large. Thus, in the third flow 1103, until $V_{dck}$ becomes the minimum, that is, the phase difference becomes 180°, the phase adjustment amount $\Delta\theta$ is stepwise increased by $\delta\theta$. Then, in S114, a degree of 180° is added to the phase adjustment amount $\Delta\theta$, and the phase difference is thereby made zero.

Next, a description will be made about the phase control method that is different from FIG. 12.

Figure 13:
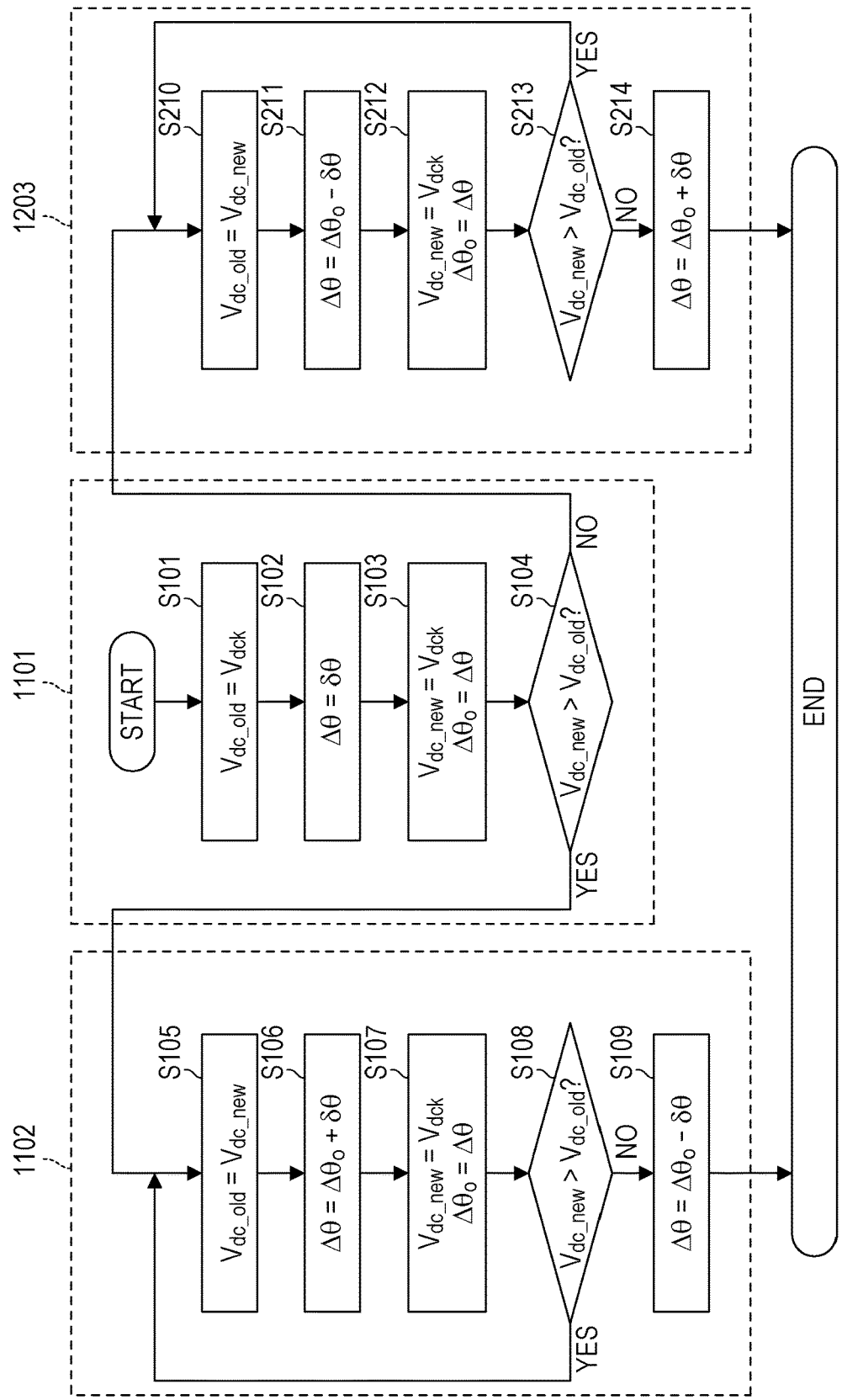
FIG. 13 is a flowchart that illustrates a second example of the phase control method in the second embodiment of the present disclosure.

FIG. 13 is a flowchart that illustrates a second example of the phase control method in the second embodiment. In FIG.

13, the same reference characters are given to similar processes to FIG. 12, and a description thereof will not be made. Note that similarly to the flow illustrated in FIG. 12, the flowchart illustrated in FIG. 13 is a flowchart in which the operation is possible in the configuration of the detector 803-$k$ in either one of FIG. 10 and FIG. 11.

The flowchart illustrated in FIG. 13 is a flowchart in which the third flow 1103 in FIG. 12 is substituted by a third flow 1203. In the following, steps of the third flow 1203 will be described.

In a case where $V_{dc\_new}$ is $V_{dc\_old}$ or smaller (NO in S104), in S210, the phase controller 805 retains $V_{dc\_new}$ as the signal $V_{dc\_old}$ that indicates the phase difference at a time before the phase is adjusted in S211.

In S211, the phase controller 805 outputs the control signal that adjusts the phase $\theta_k$ of the output signal of the kth system by $\Delta\theta=\Delta\theta_o-\delta\theta$ to the phase shifter 801-$k$. The phase shifter 801-$k$ adjusts the output signal of the kth system by $\Delta\theta$ based on the control signal and outputs the signal of the kth system in the adjusted phase, which has the phase $\theta_{k\_ad}=\theta_k+\Delta\theta$.

In S212, the phase controller 805 retains $V_{dck}$ output from the detector 803-$k$ as the signal $V_{dc\_new}$ that indicates the phase difference resulting from performance of the phase adjustment in S211. Further, the phase controller 805 retains the phase adjustment amount $\Delta\theta$ at the present time point as $\Delta\theta_o$.

In S213, the phase controller 805 assesses whether or not $V_{dc\_new}$ is larger than $V_{dc\_old}$. In a case where $V_{dc\_new}$ is larger than $V_{dc\_old}$ (YES in S213), the flow returns to S210. In a case where $V_{dc\_new}$ is $V_{dc\_old}$ or smaller (NO in S213), the flow moves to S214.

In S214, the phase controller 805 outputs the control signal that adjusts the phase $\theta_k$ of the output signal of the kth system by $\Delta\theta=\Delta\theta_o+\Delta\theta$ to the phase shifter 801-$k$. The phase shifter 801-$k$ adjusts the output signal of the kth system by $\Delta\theta$ based on the control signal and outputs the signal of the kth system in the adjusted phase, which has the phase $\theta_{k\_ad}=\theta_k+\Delta\theta$. Then, the flow finishes.

In the flowchart in FIG. 13, similarly to FIG. 12, the case where $V_{dc\_new}$ is $V_{dc\_old}$ or smaller (NO in S104) indicates that the phase adjustment in S102 is the phase adjustment in the direction in which $V_{dck}$ becomes small, that is, in the direction in which the phase difference becomes large.

Then, in the third flow 1103 in FIG. 12, until $V_{dck}$ becomes the minimum, that is, until the phase difference becomes 180°, the phase adjustment amount is stepwise increased by $\delta\theta$, a degree of 180° is added to the phase adjustment amount in S114, and the phase difference is thereby made zero. In the third flow 1203 in FIG. 13, taking into consideration that the phase adjustment in S102 is the phase adjustment in the direction in which $V_{dck}$ becomes small, that is, in the direction in which the phase difference becomes large, the change amount of the phase adjustment amount $\Delta\theta$ is changed to $-\delta\theta$ in S211. By this change, in S211, the phase adjustment in the opposite direction to the phase adjustment in S102, in other words, in the direction in which $V_{dck}$ becomes large (that is, in the direction in which the phase difference becomes small) is performed.

As described above, by the phase control method illustrated in FIG. 12 and FIG. 13, the phase difference between two signals may be adjusted, and the output signals in the same phase may be output, for example. Further, in the phase control method illustrated in FIG. 12 and FIG. 13, because the assessment is performed based on the maximum value of $V_{dck}$ that is output from the detector 803-$k$, phase control with high signal-to-noise ratio and high precision may be performed.

Next, a description will be made about the phase control method that is different from FIG. 12 and FIG. 13.

Figure 14:
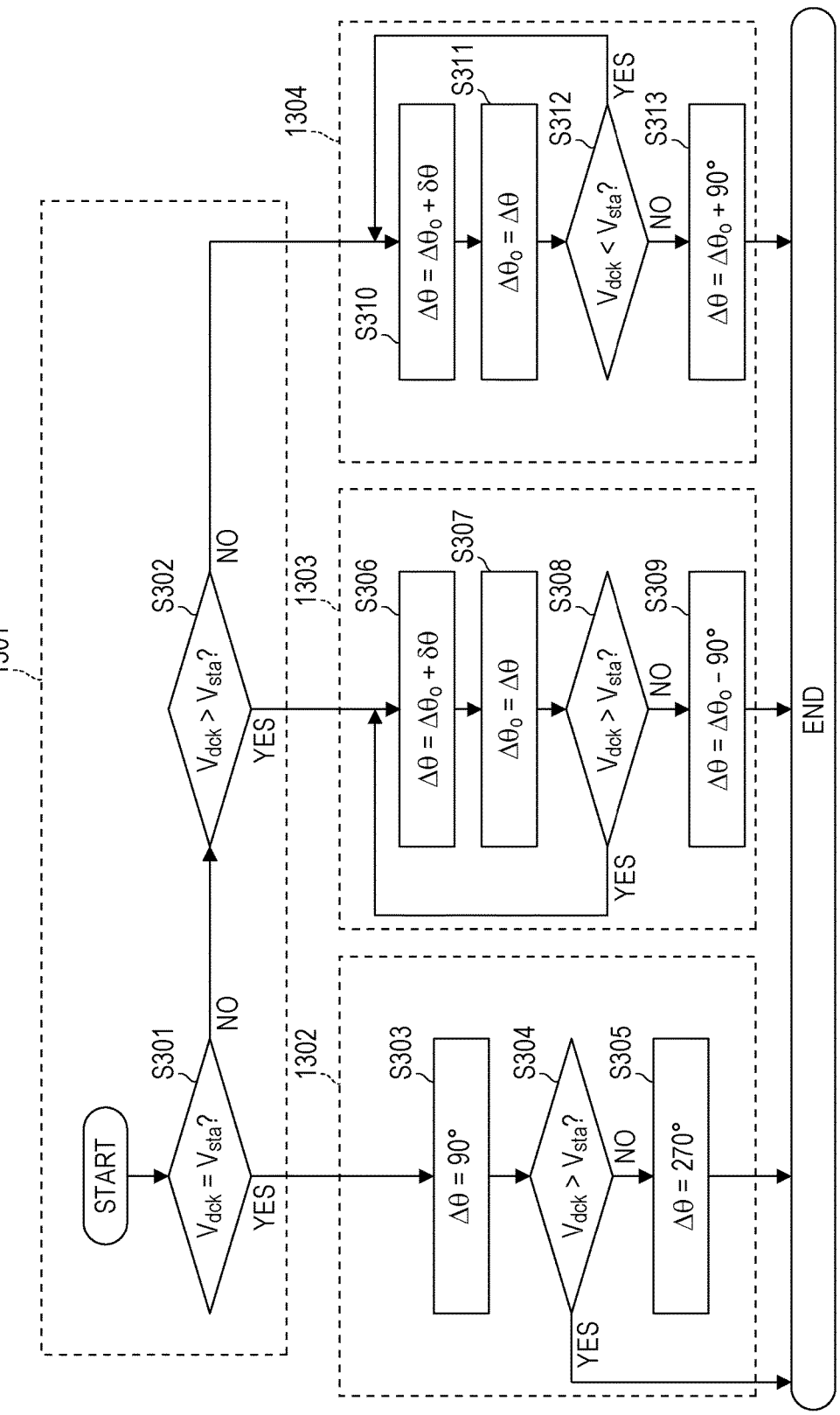
FIG. 14 is a flowchart that illustrates a third example of the phase control method in the second embodiment of the present disclosure.

FIG. 14 is a flowchart that illustrates a third example of the phase control method in the second embodiment. The flowchart illustrated in FIG. 14 is a flowchart based on the point that $V_{dck}$ that is output from the detector 803-$k$ becomes the maximum in a case where the signal of the kth system in the adjusted phase and the signal of the k+1th system in the adjusted phase are the signals in the same phase (that is, the phase difference is zero), becomes the minimum in a case where the signal of the kth system in the adjusted phase and the signal of the k+1th system in the adjusted phase are the signals in the opposite phases (that is, the phase difference is 180°), and becomes $V_{sta}$ that is the bias voltage in a case where the phase difference between the signal of the kth system in the adjusted phase and the signal of the k+1th system in the adjusted phase is 90° or 270°. Thus, the flowchart illustrated in FIG. 14 is a flowchart in which the operation is possible in the configuration of the detector 803-$k$ in FIG. 11.

After an initial flow 1301 is conducted, the flowchart illustrated in FIG. 14 moves to any one of a second flow 1302, a third flow 1303, and a fourth flow 1304 in response to the assessment result in the initial flow.

In S301, the phase controller 805 assesses whether or not $V_{dck}$ output from the detector 803-$k$ is equivalent to $V_{sta}$. In a case where $V_{dck}$ is equivalent to $V_{sta}$ (YES in S301), the flow moves to S303 of the second flow 1302. In a case where $V_{dck}$ is not equivalent to $V_{sta}$ (NO in S301), the flow moves to S302.

In a case where $V_{dck}$ is not equivalent to $V_{sta}$ (NO in S301), in S302, the phase controller 805 assesses whether or not $V_{dck}$ is larger than $V_{sta}$. In a case where $V_{dck}$ is larger than $V_{sta}$ (YES in S302), the flow moves to S306 of the third flow 1303. In a case where $V_{dck}$ is $V_{sta}$ or smaller (NO in S302), the flow moves to S310 of the fourth flow 1304.

In a case where $V_{dck}$ is equivalent to $V_{sta}$ (YES in S301), in S303, the phase controller 805 outputs the control signal for adding 90° to the phase $\theta_k$ of the output signal of the kth system, that is, the control signal that indicates $\Delta\theta=90°$ to the phase shifter 801-$k$. The phase shifter 801-$k$ adjusts the output signal of the kth system by 90° based on the control signal and outputs the signal of the kth system in the adjusted phase, which has the phase $\theta_{k\_ad}=\theta_k+90°$.

In S304, the phase controller 805 assesses whether or not $V_{dck}$ is larger than $V_{sta}$.

In a case where $V_{dck}$ is larger than $V_{sta}$ (YES in S304), the flow finishes. In a case where $V_{dck}$ is $V_{sta}$ or smaller (NO in S304), in S305, the phase controller 805 outputs the control signal for adding 270° to the phase $\theta_k$ of the output signal of the kth system, that is, the control signal that indicates $\Delta\theta=270°$ to the phase shifter 801-$k$. The phase shifter 801-$k$ adjusts the output signal of the kth system by +270° based on the control signal and outputs the signal of the kth system in the adjusted phase, which has the phase $\theta_{k\_ad}=\theta_k+270°$.

The second flow 1302 is a flow that is executed in a case where $V_{dck}$ is equivalent to $V_{sta}$ (YES in S301), that is, in a case where the phase difference is 90° or 270°. Thus, in S303, the phase is adjusted by 90°, and the phase difference thereby becomes zero or 180°. Further, in S304, whether or not $V_{dck}$ is larger than $V_{sta}$ is assessed. The case where $V_{dck}$ is larger than $V_{sta}$ (YES in S304) indicates a case where the phase difference may be adjusted to zero, in other words. Thus, the subsequent processes are not performed, and the flow finishes. On the other hand, the case where $V_{dck}$ is $V_{sta}$ or smaller (NO in S304) indicates a case where the phase difference is adjusted to 180°, in other words. Thus, in S305, the phase is adjusted by 270°, and the phase difference may thereby be adjusted to zero.

In a case where $V_{dck}$ is larger than $V_{sta}$ (YES in S302), in S306, the phase controller 805 outputs the control signal that adjusts the phase $\theta_k$ of the output signal of the kth system by $\Delta\theta = \Delta\theta_o + \delta\theta$ to the phase shifter 801-$k$. The phase shifter 801-$k$ adjusts the output signal of the kth system by $\Delta\theta$ based on the control signal and outputs the signal of the kth system in the adjusted phase, which has the phase $\theta_{k\_ad} = \theta_k + \Delta\theta$. Note that as for $\Delta\theta_o$, a value of zero is retained as the initial value.

In S307, the phase controller 805 retains the phase adjustment amount $\Delta\theta$ at the present time point as $\Delta\theta_o$.

In S308, the phase controller 805 assesses whether or not $V_{dck}$ is larger than $V_{sta}$. In a case where $V_{dck}$ is larger than $V_{sta}$ (YES in S308), the flow returns to 5306. In a case where $V_{dck}$ is $V_{sta}$ or smaller (NO in S308), the flow moves to S309.

In S309, the phase controller 805 outputs the control signal that adjusts the phase $\theta_k$ of the output signal of the kth system by $\Delta\theta = \Delta\theta_o - 90°$ to the phase shifter 801-$k$. The phase shifter 801-$k$ adjusts the phase of the output signal of the kth system based on the control signal and outputs the signal of the kth system in the adjusted phase, which has the phase $\theta_{k\_ad} = \Delta_k + \Delta\theta$. Then, the flow finishes.

In a case where $V_{dck}$ is $V_{sta}$ or smaller (NO in S302), in S310, the phase controller 805 outputs the control signal that adjusts the phase $\theta_k$ of the output signal of the kth system by $\Delta\theta = \Delta\theta_o + \delta\theta$ to the phase shifter 801-$k$. The phase shifter 801-$k$ adjusts the output signal of the kth system by $\Delta\theta$ based on the control signal and outputs the signal of the kth system in the adjusted phase, which has the phase $\theta_{k\_ad} = \theta_k + \Delta\theta$.

In S311, the phase controller 805 retains the phase adjustment amount $\Delta\theta$ at the present time point as $\Delta\theta_o$.

In S312, the phase controller 805 assesses whether or not $V_{dck}$ is smaller than $V_{sta}$. In a case where $V_{dck}$ is smaller than $V_{sta}$ (YES in S312), the flow returns to 5310. In a case where $V_{dck}$ is $V_{sta}$ or larger (NO in S312), the flow moves to S313.

In S313, the phase controller 805 outputs the control signal that adjusts the phase $\theta_k$ of the output signal of the kth system by $\Delta\theta = \Delta\theta_o + 90°$ to the phase shifter 801-$k$. The phase shifter 801-$k$ adjusts the phase of the output signal of the kth system based on the control signal and outputs the signal of the kth system in the adjusted phase, which has the phase $\theta_{k\_ad} = \theta_k + \Delta\theta$. Then, the flow finishes.

As described above, by the phase control method illustrated in FIG. 14, the phase difference between two signals may be adjusted, and the output signals in the same phase may be output, for example. Further, in the phase control method illustrated in FIG. 14, because the phase is adjusted in response to the comparison between $V_{dck}$ output from the detector 803-$k$ and $V_{sta}$ that is the bias voltage, the circuit configuration may be made simple.

Note that in the phase control method illustrated in FIG. 12 to FIG. 14, an example is described where two signals are adjusted to the same phase. However, the present disclosure is not limited to this. Because the signal that is output from the detector 803 corresponds to the phase difference between two signals, the adjustment to another phase relationship than the same phase may be performed.

Note that the phase control method illustrated in FIG. 12 to FIG. 14 is a method that adjusts the two output signals of the kth system and the k+1th system to the same phase (that is, the phase difference to zero). In a case where the power amplification division circuit 411 illustrated in FIG. 11 outputs the output signals of x systems, the phases of the two output signals are sequentially adjusted to the same phase, and all the phases of the output signals of the x systems may thereby be adjusted to the same phase.

In this case, the sequence of adjustment of the phases is controlled, and all the phases of the output signals of the x systems may thereby be adjusted to the same phase efficiently. In the following, a control method of the sequence of adjustment of the phases will be described.

Figure 15:
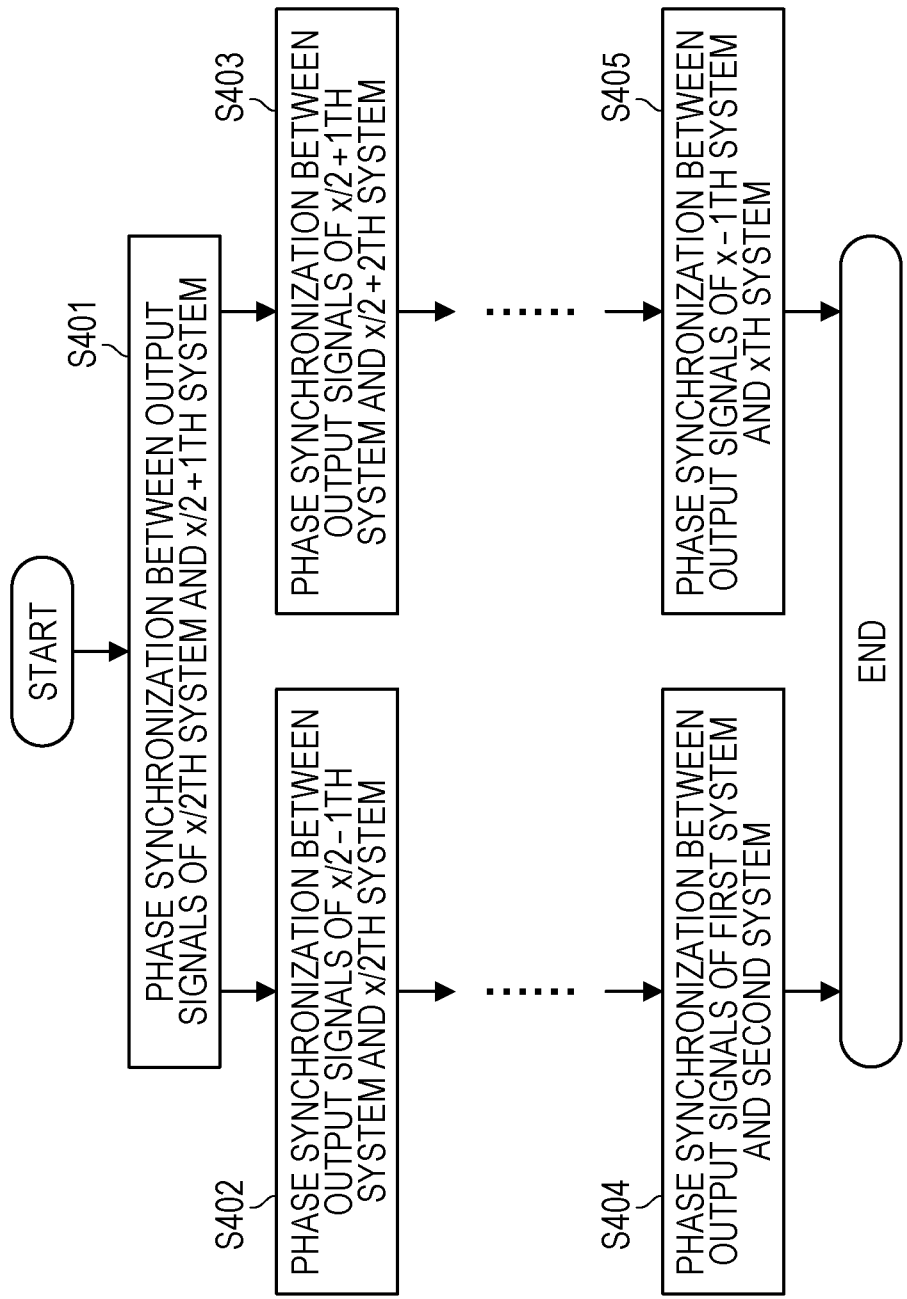
FIG. 15 is a flowchart that illustrates one example of a control method of a phase adjustment sequence in the second embodiment of the present disclosure.

FIG. 15 is a flowchart that illustrates one example of a control method of a phase adjustment sequence in the second embodiment.

In S401, the phase controller 805 adjusts the two output signals of an x/2th system and an x/2+1th system to the same phase (phase synchronization). Specifically, the phase controller 805 outputs a control signal to the phase shifter 801-(x/2) or the phase shifter 801-(x/2+1) based on the signal $V_{dc(x/2)}$ that is output from the detector 803-(x/2) and thereby performs the phase synchronization of the two output signals of the x/2th system and the x/2+1th system. In a case where the phase synchronization of the two output signals of the x/2th system and the x/2+1th system is completed, the flow moves to S402 and S403. The processes of S402 and S403 are processes that are simultaneously executed.

In S402, the phase controller 805 adjusts the two output signals of an x/2−1th system and the x/2th system to the same phase (phase synchronization). In this case, the phase controller 805 adjusts the phase of the output signal of the x/2−1th system while using the output signal of the x/2th system, for which the phase synchronization is completed in S401, as a reference. Specifically, the phase controller 805 outputs the control signal to the phase shifter 801-(x/2−1) based on a signal $V_{dc(x/2-1)}$ that is output from the detector 803-(x/2−1) and thereby performs the phase synchronization of the two output signals of the x/2−1th system and the x/2th system while using the output signal of the x/2th system as a reference.

In S403, the phase controller 805 adjusts the two output signals of the x/2+1th system and an x/2+2th system to the same phase (phase synchronization). The phase controller 805 adjusts the phase of the output signal of the x/2+2th system while using the output signal of the x/2+1th system, for which the phase synchronization is completed in S401, as a reference. Specifically, the phase controller 805 outputs the control signal to the phase shifter 801-(x/2+2) based on a signal $V_{dc(x/2+1)}$ that is output from the detector 803-(x/2+1) and thereby performs the phase synchronization of the two output signals of the x/2+1th system and the x/2+2th system while using the output signal of the x/2+1th system as a reference.

The process flows subsequent to S402 and S403 are not illustrated except S404 and S405. However, similarly to S402 and S403, the phase controller 805 adjusts the phase of the output signal of the system for which the phase synchronization is not performed while using the output signal of the system, for which the phase synchronization is completed, as a reference and thereby performs the phase synchronization of the output signals sequentially. Then, the flows move to S404 and S405.

In S404, the phase controller 805 adjusts the two output signals of the first system and a second system to the same phase (phase synchronization). In this case, the phase controller 805 adjusts the phase of the output signal of the first system while using the output signal of the second system, for which the phase synchronization is completed in the previous process (not illustrated) to S404, as a reference. Specifically, the phase controller 805 outputs the control signal to the phase shifter 801-1 based on the signal $V_{dc1}$ that is output from the detector 803-1 and thereby performs the phase synchronization of the two output signals of the first system and the second system while using the output signal of the second system as a reference.

In S405, the phase controller 805 adjusts the two output signals of an x−1th system and the xth system to the same phase (phase synchronization). The phase controller 805 adjusts the phase of the output signal of the xth system while using the output signal of the x−1th system, for which the phase synchronization is completed in the previous process (not illustrated) to S405, as a reference. Specifically, the phase controller 805 outputs the control signal to the phase shifter 801-x based on a signal $V_{dc(x-1)}$ that is output from the detector 803-(x−1) and thereby performs the phase synchronization of the two output signals of the x−1th system and the xth system while using the output signal of the x−1th system as a reference.

In a case where the processes of S404 and S405 are completed, the flow finishes.

In the following, the control method of the phase adjustment sequence that is illustrated in FIG. 15 will be described while a case where the power amplification division circuit 411 outputs the output signals of eight systems (that is, a case of x=8) is raised as an example.

First, the phase controller 805 performs the phase synchronization between the output signals of a fourth system and a fifth system among the output signals of the eight systems (S401). Next, the phase controller 805 performs the phase synchronization between the output signals of a third system and the fourth system while using the output signal of the fourth system, for which the phase synchronization is completed, as a reference (S402) and simultaneously performs the phase synchronization between the output signals of the fifth system and a sixth system while using the output signal of the fifth system, for which the phase synchronization is completed, as a reference (S403). Next, the phase controller 805 performs the phase synchronization between the output signals of the second system and the third system while using the output signal of the third system, for which the phase synchronization is completed, as a reference (not illustrated) and performs the phase synchronization between the output signals of the sixth system and a seventh system while using the output signal of the sixth system, for which the phase synchronization is completed, as a reference (not illustrated). Then, the phase controller 805 performs the phase synchronization between the output signals of the first system and the second system while using the output signal of the second system, for which the phase synchronization is completed, as a reference (S404) and performs the phase synchronization between the output signals of the seventh system and an eighth system while using the output signal of the seventh system, for which the phase synchronization is completed, as a reference (S405).

As described above, by the control method of the phase adjustment sequence that is illustrated in FIG. 15, the phase synchronization of the output signals is simultaneously performed while using the two output signals, for which the phase synchronization is completed, as references, and the phase synchronization of all the output signals may thus be performed efficiently.

Note that the control method of a phase control sequence that is illustrated in FIG. 15 demonstrates an example where the phase synchronization of all the output signals is performed. However, the present disclosure is not limited to this. Because the signal that is output from the detector 803 corresponds to the phase difference between the signals of the systems with which the detector 803 is connected, the adjustment to another phase relationship than the same phase may be performed.

Further, the control method of the phase control sequence that is illustrated in FIG. 15 is a control method for the configuration of the power amplification division circuit 811 that is illustrated in FIG. 9. However, for example, the system with which the detector 803 is connected is changed, and highly efficient control may thereby be performed.

A description will be made while a case where the power amplification division circuit 411 outputs the output signals of eight systems (that is, a case of x=8) is raised as an example.

First, the phase controller 805 performs the phase synchronization between the output signals of the fourth system and the sixth system among the output signals of the eight systems. Next, the phase controller 805 performs the phase synchronization between the output signals of the second system and the fourth system while using the output signal of the fourth system, for which the phase synchronization is completed, as a reference and performs the phase synchronization between the output signals of the sixth system and the eighth system while using the output signal of the sixth system, for which the phase synchronization is completed, as a reference. Next, the phase controller 805 performs the phase synchronization between the output signals of the first system and the second system while using the output signal of the second system, for which the phase synchronization is completed, as a reference and performs the phase synchronization between the output signals of the third system and the fourth system while using the output signal of the fourth system, for which the phase synchronization is completed, as a reference. The phase controller 805 performs the phase synchronization between the output signals of the fifth system and the sixth system while using the output signal of the sixth system, for which the phase synchronization is completed, as a reference and performs the phase synchronization between the output signals of the seventh system and the eighth system while using the output signal of the eighth system, for which the phase synchronization is completed, as a reference.

As described above, the power amplification division circuit 811 according to the second embodiment performs control of the phases of the divided signals of plural systems for the power amplification division circuit 411. By this configuration, because the phases of plural systems may be adjusted to an arbitrary phase, further preferable output signals may be obtained in the schemes, in which signal processing of signals of plural systems is performed, such as beamforming and multiple-input multiple-output (MIMO).

Note that in the second embodiment that is described above, an example is described where the configuration that controls the phases of the divided signals is provided to the output side of the power amplification division circuit 411 illustrated in FIG. 5. However, the control of the phases of the divided signals may be performed at the output of the power amplification division circuit 401.

Note that the above-described first and second embodiments, a description is made that in the N-turn annular inductor, N is an integer that is two or greater. However, embodiments are not limited to this. For example, N is not limited to an integer as long as N is larger than one. For example, N may be set as N=1.5.

Figure 16:
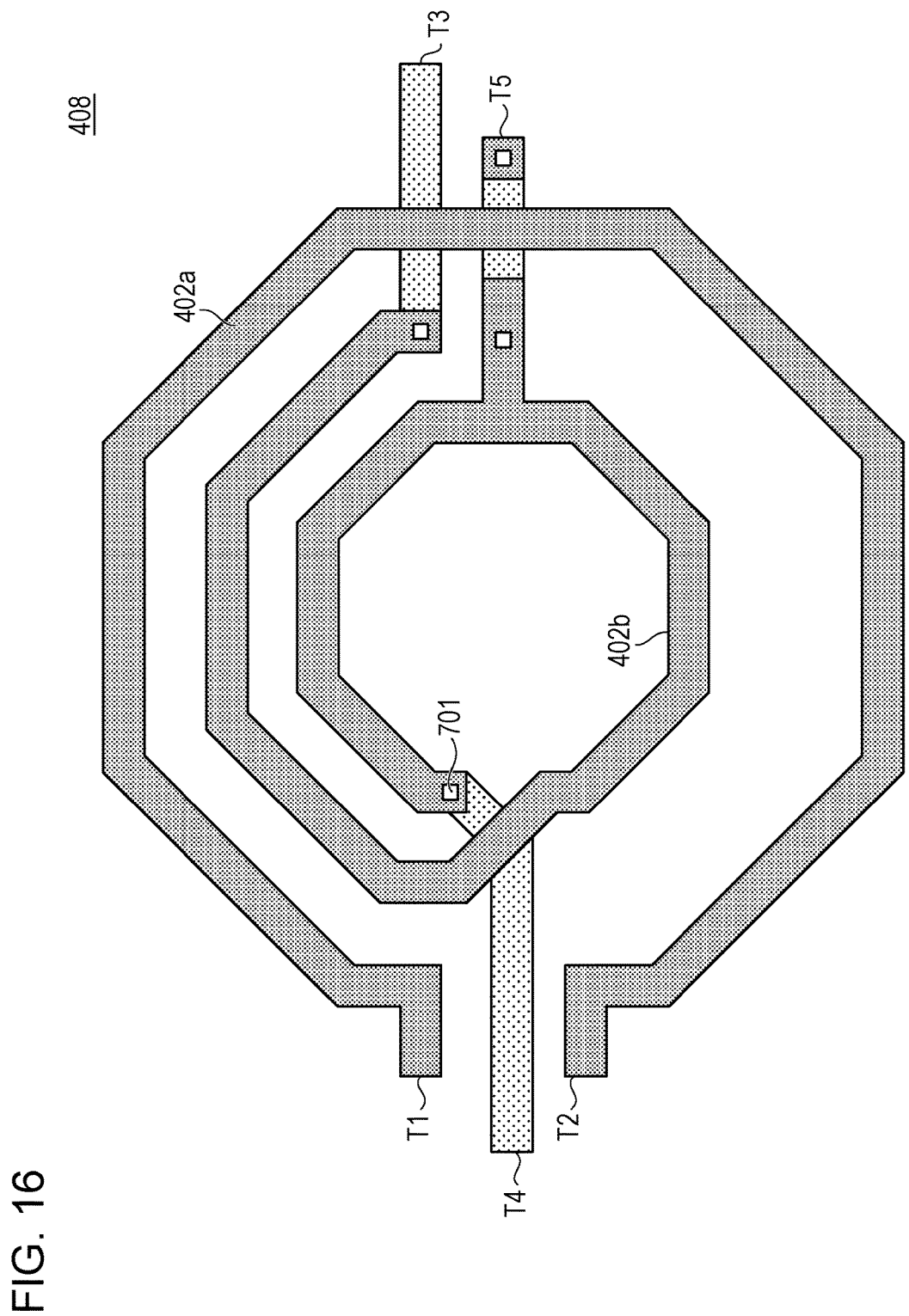
FIG. 16 is a plan diagram that illustrates a configuration example of a transformer type balun whose turn ratio is 1 to 1.5.

For example, FIG. 16 is a plan diagram that illustrates a configuration example of a transformer type balun 408 whose turn ratio is 1 to 1.5. The number of turns of the balanced side inductor 402*b* of the transformer type balun 402 illustrated in FIG. 7A and 7B is 2 (N=2). However, the number of turns of the balanced side inductor 402*b* of the transformer type balun 408 illustrated in FIG. 16 is 1.5 (N=1.5). Further, similarly to FIG. 7B, the wiring parts of the balanced side inductor 402*b* are formed in the first layer and the second layer. The wiring arrangement is similar to FIG. 7B and will thus not be described here.

Note that the center tap terminal T5 is placed in the position in which the self-inductance of the balanced side inductor 402*b* becomes 1 to 0.5. However, embodiments are not limited to this.

Further, FIG. 16 illustrates an example where the balanced side inductor 402*b* is formed in the first layer and the second layer. However, the present disclosure is not limited to this. For example, similarly to the balanced side inductor 402*b* illustrated in FIG. 8A and FIG. 8B, the balanced side inductor 402*b* in FIG. 16 may be formed in the second layer and the third layer.

In the foregoing, various embodiments have been described with reference to the drawings. However, it is matter of course that the present disclosure is not limited to such examples. It is clear that a person skilled in the art may conceive various variations and modifications within the scope described in the claims, and it is of course understood that those belong to the technical scope of the present disclosure. Further, configuration elements in the above embodiments may be arbitrarily combined in the scope that does not depart from the gist of the present disclosure.

<Overview of the Present Disclosure>

A power amplification division circuit according to the present disclosure includes: a conversion element that has a one-turn annular first inductor, the first inductor being provided with a first terminal to which an input signal is input and a second terminal which is connected with a first power source, and an N-turn (N is a greater number than one) annular second inductor, the second inductor being provided with a third terminal which outputs a positive phase signal, a fourth terminal which outputs a negative phase signal, and a fifth terminal which is connected with a second power source and being in a shape along a portion of the first inductor, and that converts the input signal into the positive phase signal and the negative phase signal; a first transistor in which a source is connected with a third power source and the positive phase signal is input to a gate; a second transistor in which a source is connected with a fourth power source and the negative phase signal is input to a gate; a first impedance circuit that is connected between the gate of the first transistor and a drain of the second transistor; a second impedance circuit that is connected between the gate of the second transistor and a drain of the first transistor; and an output matching circuit that is connected with the drain of the first transistor and the drain of the second transistor and respectively outputs a first divided signal and a second divided signal from a first output terminal and a second output terminal.

In the power amplification division circuit according to the present disclosure, the output matching circuit performs impedance conversion of an output of the drain of the first transistor and an output of the drain of the second transistor to equalize impedance of the first terminal with impedance of the first output terminal and impedance of the second output terminal.

In the power amplification division circuit according to the present disclosure, each of the first impedance circuit and the second impedance circuit has a capacitor.

In the power amplification division circuit according to the present disclosure, each of the first impedance circuit and the second impedance circuit has a resistance that is connected with the capacitor in series.

The power amplification division circuit according to the present disclosure further includes: a first phase shifter that is connected with the first output terminal and outputs a first adjusted phase signal which is the first divided signal in an adjusted phase; a first directional coupler that is connected with the first phase shifter and branches and outputs the first adjusted phase signal; a second phase shifter that is connected with the second output terminal and outputs a second adjusted phase signal which is the second divided signal in an adjusted phase; a second directional coupler that is connected with the second phase shifter and branches and outputs the second adjusted phase signal; a detector that is connected with the first directional coupler and the second directional coupler and outputs a signal which indicates a phase difference between the first adjusted phase signal and the second adjusted phase signal; and a phase controller that is connected with the detector, the first phase shifter, and the second phase shifter and controls a phase adjustment amount which is adjusted by the first phase shifter and/or the second phase shifter based on the phase difference.

The power amplification division circuit according to the present disclosure further includes: a first terminal end element that is connected with the first directional coupler and terminates a portion of an output of the first adjusted phase signal; and a second terminal end element that is connected with the second directional coupler and terminates a portion of an output of the second adjusted phase signal.

In a multi-stage type power amplification division circuit according to the present disclosure that connects plural power amplification division circuits, each of the plural power amplification division circuits includes: a conversion element that has a one-turn annular first inductor, the first inductor being provided with a first terminal to which an input signal is input and a second terminal which is connected with a first power source, and an N-turn (N is a greater number than one) annular second inductor, the second inductor being provided with a third terminal which outputs a positive phase signal, a fourth terminal which outputs a negative phase signal, and a fifth terminal which is connected with a second power source and being in a shape along a portion of the first inductor, and that converts the input signal into the positive phase signal and the negative phase signal; a first transistor in which a source is connected with a third power source and the positive phase signal is input to a gate; a second transistor in which a source is connected with a fourth power source and the negative phase signal is input to a gate; a first impedance circuit that is connected between the gate of the first transistor and a drain of the second transistor; a second impedance circuit that is connected between the gate of the second transistor and a drain of the first transistor; and an output matching circuit that is connected with the drain of the first transistor and the drain of the second transistor and respectively outputs a first divided signal and a second divided signal from a first output terminal and a second output terminal. The first output terminal of a first power amplification division circuit is connected with the first terminal of a second power amplification division circuit, the second output terminal of the first power amplification division circuit is connected with the first terminal of a third power amplification division circuit, and divided signals of X systems are output from X (X is an integer that is two or greater) output terminals that are not connected with the first terminals of the plural power amplification division circuits.

The multi-stage type power amplification division circuit according to the present disclosure further includes: X phase shifters that are respectively connected with the X output terminals and respectively output a first adjusted phase signal to an Xth adjusted phase signal in which phases of divided signals of respective systems are adjusted; X directional couplers that are respectively connected with the X phase shifters and branch and output the first adjusted phase signal to the Xth adjusted phase signal; an ith detector that is connected with an ith directional coupler (i is an integer that is one or greater but X−1 or less) and an i+1th directional coupler and outputs a signal which indicates a phase difference between an ith adjusted phase signal and an i+1th adjusted phase signal; and a phase controller that is connected with the ith detector, an ith phase shifter, and an i+1th phase shifter and controls a phase adjustment amount which is adjusted by the ith phase shifter and/or the i+1th phase shifter based on the phase difference.

The multi-stage type power amplification division circuit according to the present disclosure further includes: a first terminal end element that is connected with a first directional coupler and terminates a portion of an output of a first adjusted phase signal; and a second terminal end element that is connected with an Xth directional coupler and terminates a portion of an output of an Xth adjusted phase signal.

In the multi-stage type power amplification division circuit according to the present disclosure, the phase controller controls the phase adjustment amount that is adjusted by the ith phase shifter and/or the i+1th phase shifter based on the signal that is output from the ith detector (i is an integer that is two or greater but X−2 or less) and indicates the phase difference, and after the phase adjustment amount that is adjusted by the ith phase shifter and/or the i+1th phase shifter is decided, controls a phase adjustment amount that is adjusted by the i−1th phase shifter based on a signal that is output from an i−1th detector and indicates a phase difference, and controls a phase adjustment amount that is adjusted by the i+2th phase shifter based on a signal that is output from an i+1th detector and indicates a phase difference.

A power amplification division circuit according to the present disclosure is useful for high-resolution radars and high-speed communication.

What is claimed is:

1. A power amplification division circuit comprising:
   a conversion element that has a one-turn annular first inductor, the first inductor being provided with a first terminal to which an input signal is input and a second terminal which is connected with a first power source, and an N-turn, where N is a greater number than one, annular second inductor, the second inductor being provided with a third terminal which outputs a positive phase signal, a fourth terminal which outputs a negative phase signal, and a fifth terminal which is connected with a second power source and being in a shape along a portion of the first inductor, and that converts the input signal into the positive phase signal and the negative phase signal;
   a first transistor in which a source is connected with a third power source and the positive phase signal is input to a gate;
   a second transistor in which a source is connected with a fourth power source and the negative phase signal is input to a gate;
   a first impedance circuit that is connected between the gate of the first transistor and a drain of the second transistor;
   a second impedance circuit that is connected between the gate of the second transistor and a drain of the first transistor; and
   an output matching circuit that is connected with the drain of the first transistor and the drain of the second transistor and respectively outputs a first divided signal and a second divided signal from a first output terminal and a second output terminal.

2. The power amplification division circuit according to claim 1, wherein
   the output matching circuit performs impedance conversion of an output of the drain of the first transistor and an output of the drain of the second transistor to equalize impedance of the first terminal with impedance of the first output terminal and impedance of the second output terminal.

3. The power amplification division circuit according to claim 1, wherein
   each of the first impedance circuit and the second impedance circuit has a capacitor.

4. The power amplification division circuit according to claim 3, wherein
   each of the first impedance circuit and the second impedance circuit has a resistance that is connected with the capacitor in series.

5. The power amplification division circuit according to claim 1, further comprising:
   a first phase shifter that is connected with the first output terminal and outputs a first adjusted phase signal which is the first divided signal in an adjusted phase;
   a first directional coupler that is connected with the first phase shifter and branches and outputs the first adjusted phase signal;
   a second phase shifter that is connected with the second output terminal and outputs a second adjusted phase signal which is the second divided signal in an adjusted phase;
   a second directional coupler that is connected with the second phase shifter and branches and outputs the second adjusted phase signal;
   a detector that is connected with the first directional coupler and the second directional coupler and outputs a signal which indicates a phase difference between the first adjusted phase signal and the second adjusted phase signal; and
   a phase controller that is connected with the detector, the first phase shifter, and the second phase shifter and controls a phase adjustment amount which is adjusted by the first phase shifter and/or the second phase shifter based on the phase difference.

6. The power amplification division circuit according to claim 5, further comprising:
   a first terminal end element that is connected with the first directional coupler and terminates a portion of an output of the first adjusted phase signal; and
   a second terminal end element that is connected with the second directional coupler and terminates a portion of an output of the second adjusted phase signal.

7. A multi-stage type power amplification division circuit that connects plural power amplification division circuits, wherein
   each of the plural power amplification division circuits includes a conversion element that has a one-turn annular first inductor, the first inductor being provided with a first terminal to which an input signal is input and a second terminal which is connected with a first power source, and an N-turn, where N is a greater number than one, annular second inductor, the second inductor being provided with a third terminal which outputs a positive phase signal, a fourth terminal which outputs a negative phase signal, and a fifth terminal which is connected with a second power source and being in a shape along a portion of the first inductor, and that converts the input signal into the positive phase signal and the negative phase signal, a first transistor in which a source is connected with a third power source and the positive phase signal is input to a gate, a second transistor in which a source is connected with a fourth power source and the negative phase signal is input to a gate, a first impedance circuit that is connected between the gate of the first transistor and a drain of the second transistor, a second impedance circuit that is connected between the gate of the second transistor and a drain of the first transistor, and an output matching circuit that is connected with the drain of the first transistor and the drain of the second transistor and respectively outputs a first divided signal and a second divided signal from a first output terminal and a second output terminal, the first output terminal of a first power amplification division circuit is connected with the first terminal of a second power amplification division circuit, the second output terminal of the first power amplification division circuit is connected with the first terminal of a third power amplification division circuit, and divided signals of X systems are output from X, where X is an integer that is two or greater, output terminals that are not connected with the first terminals of the plural power amplification division circuits.

8. The multi-stage type power amplification division circuit according to claim 7, further comprising:

X phase shifters that are respectively connected with the X output terminals and respectively output a first adjusted phase signal to an Xth adjusted phase signal in which phases of divided signals of respective systems are adjusted;

X directional couplers that are respectively connected with the X phase shifters and branch and output the first adjusted phase signal to the Xth adjusted phase signal;

an ith detector that is connected with an ith directional coupler, where i is an integer that is one or greater but X−1 or less, and an i+1th directional coupler and outputs a signal which indicates a phase difference between an ith adjusted phase signal and an i+1th adjusted phase signal; and a phase controller that is connected with the ith detector, an ith phase shifter, and an i+1th phase shifter and controls a phase adjustment amount which is adjusted by the ith phase shifter and/or the i+1th phase shifter based on the phase difference.

9. The multi-stage type power amplification division circuit according to claim 8, further comprising:

a first terminal end element that is connected with a first directional coupler and terminates a portion of an output of a first adjusted phase signal; and a second terminal end element that is connected with an Xth directional coupler and terminates a portion of an output of an Xth adjusted phase signal.

10. The multi-stage type power amplification division circuit according to claim 8, wherein the phase controller controls the phase adjustment amount that is adjusted by the ith phase shifter and/or the i+1th phase shifter based on the signal that is output from the ith detector, where i is an integer that is two or greater but X−2 or less, and indicates the phase difference, and after the phase adjustment amount that is adjusted by the ith phase shifter and/or the i+1th phase shifter is decided, controls a phase adjustment amount that is adjusted by the i−1th phase shifter based on a signal that is output from an i−1th detector and indicates a phase difference, and controls a phase adjustment amount that is adjusted by the i+2th phase shifter based on a signal that is output from an i+1th detector and indicates a phase difference.

* * * * *